(12) United States Patent
Yang

(10) Patent No.: US 11,114,536 B1
(45) Date of Patent: Sep. 7, 2021

(54) SEMICONDUCTOR DEVICE HAVING MULTIPLE DIMENSIONS OF GATE STRUCTURES AND METHOD FOR FABRICATING THE SAME

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/801,685

(22) Filed: Feb. 26, 2020

(51) Int. Cl.
*H01L 29/423* (2006.01)
*H01L 29/40* (2006.01)

(52) U.S. Cl.
CPC ...... *H01L 29/42364* (2013.01); *H01L 29/401* (2013.01); *H01L 29/4238* (2013.01)

(58) Field of Classification Search
CPC ............ H01L 29/42364; H01L 29/401; H01L 29/4238; H01L 29/4236
See application file for complete search history.

(56) References Cited

U.S. PATENT DOCUMENTS

2015/0349091 A1* 12/2015 Yilmaz ............... H01L 29/4975
438/270

* cited by examiner

*Primary Examiner* — Changhyun Yi
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate including an array area and a peripheral area adjacent to the array area, a first gate structure positioned in the array area, and a second gate structure positioned in the peripheral area. A width of the first gate structure is less than a width of the second gate structure, and a depth of the first gate structure is less than a depth of the second gate structure.

19 Claims, 21 Drawing Sheets

SEMICONDUCTOR DEVICE HAVING MULTIPLE DIMENSIONS OF GATE STRUCTURES AND METHOD FOR FABRICATING THE SAME

TECHNICAL FIELD

The present disclosure relates to a semiconductor device and a method for fabricating the semiconductor device, and more particularly, to a semiconductor device with multiple dimensions of gate structures and a method for fabricating the semiconductor device with the multiple dimensions of gate structures.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate including an array area and a peripheral area surrounding the array area, a first gate structure positioned in the array area, and a second gate structure positioned in the peripheral area. A width of the first gate structure is less than a width of the second gate structure and a depth of the first gate structure is less than a depth of the second gate structure.

In some embodiments, the first gate structure includes a first gate insulating layer inwardly positioned in the array area, a first gate conductive layer positioned on the first gate insulating layer, and a first bottom capping layer positioned on the first gate conductive layer. A top surface of the first bottom capping layer is at a same vertical level as a top surface of the substrate.

In some embodiments, a top surface of the first gate conductive layer is at a vertical level higher than a vertical level of top surfaces of the first gate insulating layer.

In some embodiments, the semiconductor device includes a plurality of first doped regions positioned adjacent to two sides of the first gate structure. Bottom surfaces of the first doped regions are at a same vertical level as the top surface of the first gate conductive layer.

In some embodiments, the semiconductor device includes a first gate liner positioned between the first gate insulating layer and the first gate conductive layer.

In some embodiments, top surfaces of the first gate liner are at a vertical level lower than the vertical level of the top surface of the first gate conductive layer.

In some embodiments, the semiconductor device includes a second gate structure including a second gate insulating layer inwardly positioned in the peripheral area, a second gate conductive layer positioned on the second gate insulating layer, and a second bottom capping layer positioned on the second gate conductive layer. A top surface of the second bottom capping layer is at a same vertical level as the top surface of the substrate. A top surface of the second gate conductive layer is at a vertical level lower than the vertical level of the top surface of the first gate conductive layer.

In some embodiments, the semiconductor device includes a plurality of second doped regions positioned adjacent to two sides of the second gate structure. Bottom surfaces of the second doped regions are at a same vertical level as the top surface of the second gate conductive layer.

In some embodiments, the semiconductor device includes a first top capping layer positioned on the first bottom capping layer.

In some embodiments, the semiconductor device includes a plurality of third doped regions positioned adjacent to two sides of the first top capping layer and on the plurality of first doped regions.

In some embodiments, the semiconductor device includes a plurality of first isolation structures positioned in the array area and a plurality of second isolation structures positioned in the peripheral area. The first gate structure is positioned between an adjacent pair of the plurality of first isolation structures and the second gate structure is positioned between an adjacent pair of the plurality of second isolation structures.

In some embodiments, a depth of the plurality of second isolation structures is greater than a depth of the plurality of first isolation structures.

In some embodiments, a porosity of the first top capping layer is between about 10% and about 30%.

In some embodiments, the first gate insulating layer has a thickness between about 13 angstroms and about 20 angstroms.

In some embodiments, the first gate liner has a thickness between about 10 angstroms and about 15 angstroms.

Another aspect of the present disclosure provides a method for fabricating a semiconductor device including providing a substrate including an array area and a peripheral area surrounding the array area, forming a first gate structure in the array area, and forming a second gate structure in the peripheral area and having a width greater than a width of the first gate structure and a depth greater than a depth of the first gate structure.

In some embodiments, the first gate structure and the second gate structure are concurrently formed.

In some embodiments, the method for fabricating the semiconductor device includes forming a plurality of first doped regions adjacent to two sides of the first gate structure and in the array area and forming a plurality of second doped regions adjacent to two sides of the second gate structure and in the peripheral area.

In some embodiments, the method for fabricating the semiconductor device includes forming a plurality of third doped regions on the plurality of first doped regions and forming a plurality of fourth doped regions on the plurality of second doped regions.

In some embodiments, the plurality of first doped regions and the plurality of third doped regions have different electrical types.

Due to the design of the semiconductor device of the present disclosure, different dimensions of gate structures (e.g., the first gate structure and the second gate structure)

may be easily fabricated with the assistance of the loading effect. Therefore, the complexity of fabricating the semiconductor device may be reduced. As a result, the cost of fabrication of the semiconductor device may also be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
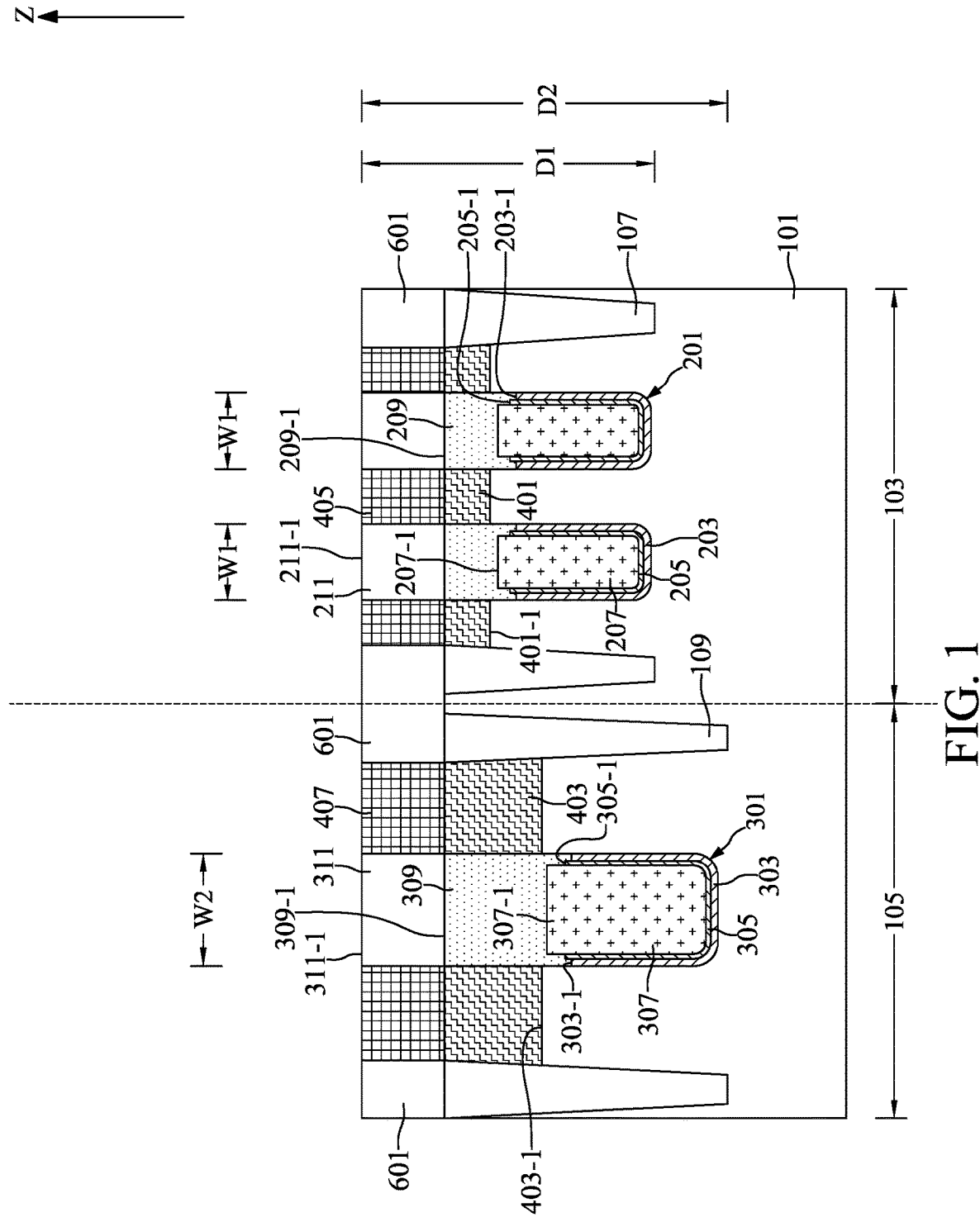
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, the term "about" modifying the quantity of an ingredient, component, or reactant of the present disclosure refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

In the present disclosure, a semiconductor device generally means a device which can function by utilizing semiconductor characteristics, and an electro-optic device, a light-emitting display device, a semiconductor circuit, and an electronic device are all included in the category of the semiconductor device.

FIG. 1 illustrates, in a schematic cross-sectional diagram, a semiconductor device in accordance with one embodiment of the present disclosure.

With reference to FIG. 1, in the embodiment depicted, the semiconductor device may include a substrate 101, a plurality of first isolation structures 107, a plurality of second isolation structures 109, a plurality of first gate structures 201, a second gate structure 301, a plurality of first doped regions 401, a plurality of second doped regions 403, a plurality of third doped regions 405, a plurality of fourth doped regions 407 and a first insulating layer 601.

With reference to FIG. 1, in the embodiment depicted, the substrate 101 may include an array area 103 and a peripheral area 105. The array area 103 may be surrounded by the peripheral area 105. In some embodiments, the substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant. In some embodiments, the substrate 101 may include an organic semiconductor or a layered semiconductor such as silicon/silicon germanium, silicon-on-insulator or silicon germanium-on-insulator.

When the substrate 101 is formed of silicon-on-insulator, the substrate 101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof. In some embodiments, the substrate 101 may be doped with a dopant such as phosphorus, arsenic, antimony, or boron. In the embodiment depicted, the substrate 101 may be doped with boron and may have a first electrical type.

It should be noted that the array area 103 may include a portion of the substrate 101 and a space above the portion of the substrate 101. Describing an element as being disposed on the array area 103 means that the element is disposed on a top surface of the portion of the substrate 101. Describing an element as being disposed above the array area 103 means that the element is disposed above the top surface of the portion of the substrate 101. In some embodiments, describing an element as being disposed in the array area 103 means that the element is disposed in the portion of the substrate 101; however, a top surface of the element may be even with the top surface of the portion of the substrate 101. In some embodiments, describing an element as being disposed in the array area 103 means that portions of the element are disposed in the substrate 101 and other portions of the element are disposed on or above the substrate 101.

Accordingly, the peripheral area 105 may include another portion of the substrate 101 and a space above the other portion of the substrate 101.

With reference to FIG. 1, in the embodiment depicted, the plurality of first isolation structures 107 may be disposed in the array area 103. Top surfaces of the plurality of first isolation structures 107 may be even with the top surface of the substrate 101. The plurality of first isolation structures 107 may be formed of, for example, an insulating material such as silicon oxide, silicon nitride, silicon oxynitride, silicon nitride oxide, or fluoride-doped silicate. The plurality of second isolation structures 109 may be disposed in the peripheral area 105. Top surfaces of the plurality of second isolation structures 109 may be even with the top surface of the substrate 101. In some embodiments, a depth of the plurality of first isolation structures 107 may be less than a depth of the plurality of second isolation structures 109. In some embodiments, the plurality of first isolation structures 107 may have a same depth as the plurality of second isolation structures 109. In the embodiment depicted, the plurality of second isolation structures 109 may be formed of a same material as the plurality of first isolation structures 107, but are not limited thereto.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

In the embodiment depicted, the array area 103 may have an element density greater than that of the peripheral area 105. The element density may be a value defined by the elements (e.g., gate structures) disposed in the array area 103 or the peripheral area 105 divided by surface areas of the array area 103 or peripheral area 105 from a top-view perspective. From a cross-sectional perspective, a greater density may mean a smaller horizontal distance between adjacent elements. In other words, the array area 103 may be regarded as a dense area and the peripheral area 105 may be regarded as a loose area. With reference to FIG. 1, in the embodiment depicted, the plurality of first gate structures 201 may be disposed in the array area 103. The second gate structure 301 may be disposed in the peripheral area 105. More first gate structures 201 are shown in FIG. 1 to emphasize that the array area 103 is a dense area compared to the peripheral area 105. Numbers of the first gate structure 201 or the second gate structure 301 are illustrative only. For example, the number of the second gate structures 301 may be more than one.

With reference to FIG. 1, in the embodiment depicted, for each of the plurality of first gate structures 201, a width W1 of the first gate structure 201 may be less than a width W2 of the second gate structure 301. A top surface of the first gate structure 201 may be at a same vertical level as a top surface of the second gate structure 301. A depth D1 of the first gate structure 201 may be less than a depth D2 of the second gate structure 301. The plurality of first gate structures 201 and the second gate structure 301 may be formed concurrently during fabrication of the semiconductor device.

With reference to FIG. 1, in the embodiment depicted, each of the plurality of first gate structures 201 may include a first gate insulating layer 203, a first gate liner 205, a first gate conductive layer 207, a first bottom capping layer 209, and a first top capping layer 211.

With reference to FIG. 1, in the embodiment depicted, the first gate insulating layer 203 may be inwardly disposed in the array area 103. The first gate insulating layer 203 may have a U-shaped cross-sectional profile. In some embodiments, the bottom surface of the first gate insulating layer 203 may be flat. In some embodiments, the bottom surface of the first gate insulating layer 203 may be rounded to reduce defect density and reduce electric field concentration during the operation of the semiconductor device. The first gate insulating layer 203 may prevent junction leakage and prevent dopants in the plurality of first doped regions 401 from migrating into the first gate conductive layer 207. The first gate conductive layer 207 and the plurality of first doped regions 401 will be described in detail later.

In some embodiments, the first gate insulating layer 203 may be formed of, for example, silicon oxide. In some embodiments, the first gate insulating layer 203 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the first gate insulating layer 203 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. The first gate insulating layer 203 may have a thickness between about 13 angstroms and about 20 angstroms. In some embodiments, the first gate insulating layer 203 may have a thickness between about 14 angstroms and about 16 angstroms.

In some embodiments, the first gate insulating layer 203 may be a multilayer structure that includes, for example, one layer of silicon oxide and another layer of high-k dielectric material. The one layer of silicon oxide may be regarded as an interfacial layer (not shown in FIG. 1) disposed between the first gate insulating layer 203 and the substrate 101. The interfacial layer may have a thickness between about 7 angstroms and 12 angstroms. In some embodiments, the interfacial layer may have a thickness between about 8 angstroms and 10 angstroms. The interfacial layer may facilitate the formation of the first gate insulating layer 203 during fabrication of the semiconductor device. A width of the first gate insulating layer 203 may be referred to as the width W1 of the first gate structure 201.

With reference to FIG. 1, in the embodiment depicted, the first gate liner 205 may be inwardly disposed on the first gate insulating layer 203. The first gate liner 205 may have a U-shaped cross-sectional profile. In the embodiment depicted, the first gate liner 205 may be formed of, for example, titanium nitride, tantalum nitride, titanium, tantalum, titanium tungsten, the like, or a combination thereof. The first gate liner 205 may have a thickness between about 10 angstroms and about 15 angstroms. In some embodiments, the first gate liner 205 may have a thickness between about 11 angstroms and about 13 angstroms.

In some embodiments, top surfaces 205-1 of the first gate liner 205 may be located at a vertical level higher than a vertical level of top surfaces 203-1 of the first gate insulating layer 203. A difference between vertical levels of the top surfaces 203-1 of the first gate insulating layer 203 and the top surfaces 205-1 of the first gate liner 205 may be less than 25 angstroms. In some embodiments, the difference between vertical levels of the top surfaces 203-1 of the first gate insulating layer 203 and the top surfaces 205-1 of the first gate liner 205 may be less than 15 angstroms, or less than 5 angstroms. In some embodiments, the top surfaces 203-1 of the first gate insulating layer 203 may be located at a same vertical level as the top surfaces 205-1 of the first gate liner 205.

The first gate liner 205 may serve as a protective layer for its underlying structure (e.g., the first gate insulating layer 203) during formation of the first gate conductive layer 207. The first gate liner 205 may also serve as an adhesive layer between the first gate insulating layer 203 and the first gate conductive layer 207. The first gate liner 205 may be employed to prevent the first gate conductive layer 207 from flaking or spalling from the first gate insulating layer 203.

With reference to FIG. 1, in the embodiment depicted, the first gate conductive layer 207 may be disposed on the first gate liner 205 and in the array area 103. The top surfaces 205-1 of the first gate liner 205 and the top surfaces 203-1 of the first gate insulating layer 203 may be respectively correspondingly disposed adjacent to two sides of the first gate conductive layer 207. In some embodiments, a top surface 207-1 of the first gate conductive layer 207 may be located at a vertical level higher than the top surfaces 205-1 of the first gate liner 205 or the top surfaces 203-1 of the first gate insulating layer 203. A difference between vertical levels of the top surface 207-1 of the first gate conductive layer 207 and the top surfaces 205-1 of the first gate liner 205 may be less than 15 angstroms. In some embodiments, the difference between vertical levels of the top surface 207-1 of the first gate conductive layer 207 and the top surfaces 205-1 of the first gate liner 205 may be less than 10 angstroms, or less than 5 angstroms. In some embodiments, the top surface 207-1 of the first gate conductive layer 207 may be located at a same vertical level as the top surfaces 205-1 of the first gate liner 205 or the top surfaces 203-1 of the first gate insulating layer 203. The first gate conductive layer 207 may be formed of, for example, tungsten, aluminum, titanium, copper, the like, or a combination thereof. Specifically, the first gate conductive layer 207 may be formed of tungsten.

With reference to FIG. 1, in the embodiment depicted, the first bottom capping layer 209 may be disposed on the top surface 207-1 of the first gate conductive layer 207, the top surfaces 205-1 of the first gate liner 205, and the top surfaces 203-1 of the first gate insulating layer 203. The first bottom capping layer 209 may be disposed in the array area 103. A top surface 209-1 of the first bottom capping layer 209 may be even with the top surface of the substrate 101. In other words, the top surface 209-1 of the first bottom capping layer 209 may be located at a same vertical level as the top surface of the substrate 101. The first bottom capping layer 209 may have a same width as the first gate insulating layer 203. In some embodiments, the first bottom capping layer 209 may be formed of, for example, silicon oxide. In some embodiments, the first bottom capping layer 209 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof.

With reference to FIG. 1, in the embodiment depicted, the first top capping layer 211 may be disposed on the first bottom capping layer 209. In some embodiments, the first top capping layer 211 may have a same width as the first bottom capping layer 209. In some embodiments, the first top capping layer 211 may have a width less than the width of the first bottom capping layer 209. A vertical distance from the bottom surface of the first gate insulating layer 203 to the top surface 211-1 of the first top capping layer 211 may be referred to as the depth D1 of the plurality of first gate structures 201.

In some embodiments, the first top capping layer 211 may be formed of, for example, silicon oxide. In some embodiments, the first top capping layer 211 may be formed of, for example, a low-k dielectric material. The low-k dielectric material may have a dielectric constant less than 3.0 or even less than 2.5. In some embodiments, the low-k dielectric material may have a dielectric constant less than 2.0. In some embodiments, the low-k dielectric material may be carbon doped oxide or porous carbon doped silicon oxide. When the first top capping layer 211 is formed of the low-k dielectric material, an electrical field at the top surface 211-1 of the first top capping layer 211 may be reduced by the low-k material such that leakage current may be reduced.

In some embodiments, the first top capping layer 211 may be formed from an energy removable material and may have a porosity between 10% and 30%. The first top capping layer 211 may include a skeleton and a plurality of empty spaces disposed within the skeleton. The plurality of empty spaces may be connected to each other and may be filled with air. The skeleton may include, for example, silicon oxide or methylsilsesquioxane. The plurality of empty spaces of the first top capping layer 211 may be filled with air. As a result, a dielectric constant of the first top capping layer 211 may be significantly lower than a capping layer formed of only silicon oxide. Therefore, the first top capping layer 211 may significantly reduce the parasitic capacitance of adjacent conductive features. That is, the first top capping layer 211 having the porosity between about 10% and about 30% may significantly alleviate an interference effect between electrical signals induced or applied to the semiconductor device.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. The energy source may include heat, light, or a combination thereof. The base material may include a methylsilsesquioxane-based material or silicon oxide. The decomposable porogen material may include a porogen organic compound that provides porosity to the base material of the energy-removable material. In some embodiments, the energy-removable material may include about 70% or greater of the base material, and about 30% or less of the decomposable porogen material. In some embodiments, the energy-removable material may include about 90% or greater of the base material, and about 10% or less of the decomposable porogen material.

With reference to FIG. 1, in the embodiment depicted, the plurality of first doped regions 401 may be disposed adjacent to sides of the plurality of first gate structures 201 and in the array area 103. Top surfaces of the plurality of first doped regions 401 may be even with the top surface of the substrate 101. Specifically, the plurality of first doped regions 401 may be disposed adjacent to two sides of the first bottom capping layer 209. Bottom surfaces 401-1 of the first doped regions 401 may be located at a same vertical level as the top surface 207-1 of the first gate conductive layer 207. The plurality of first doped regions 401 may be doped with a dopant such as phosphorus, arsenic, antimony, or boron. In the embodiment depicted, the plurality of first doped regions 401 may be doped with boron and may have the first electrical type. In some embodiments, the plurality of first doped regions 401 may have a dopant concentration greater than a dopant concentration of the substrate 101.

When an operating voltage is applied to the first gate conductive layer 207, an inversion region may be formed in the array area 103 and along the first gate insulating layer 203. Accordingly, the first bottom capping layer 209 formed of high-k material may induce a fringing field between the first gate conductive layer 207 and the plurality of first doped regions 401. The fringing field may extend the inversion region to the plurality of first doped regions 401. The extended inversion region may reduce an electrical resistance of the plurality of first doped regions 401 such that current flowing into a bit line (not shown in FIG. 1) or a storage node (not shown in FIG. 1) may be increased. That is, the first bottom capping layer 209 may increase current drivability of the semiconductor device.

With reference to FIG. 1, in the embodiment depicted, the plurality of third doped regions 405 may be disposed on the plurality of first doped regions 401 and on the substrate 101. The plurality of third doped regions 405 may be disposed adjacent to sides of the first top capping layer 211. Two adjacent third doped regions 405 may be electrically insulated by the first top capping layer 211 interposed therebetween. Top surfaces of the plurality of third doped regions 405 may be even with the top surface 211-1 of the first top capping layer 211. The plurality of third doped regions 405 may be formed of, for example, silicon, germanium, silicon germanium, silicon carbon, silicon germanium carbon, gallium, gallium arsenic, indium arsenic, or indium phosphorus. The plurality of third doped regions 405 may be doped with a dopant such as phosphorus, arsenic, antimony, or boron. In the embodiment depicted, the plurality of first doped regions 401 may be doped with a dopant such as phosphorus, arsenic, or antimony and may have the second electrical type. In some embodiments, the plurality of third doped regions 405 may have a dopant concentration greater than the dopant concentration of the plurality of first doped regions 401.

In some embodiments, the plurality of third doped regions 405 may be formed of, for example, silicon germanium or silicon carbide and may have a second lattice constant that is different from the first lattice constant of the substrate 101. The second lattice constant of the first top capping layer 211 is different from the first lattice constant of the substrate 101; therefore, the carrier mobility of the semiconductor device may be increased, and the performance of the semiconductor device may be improved.

With reference to FIG. 1, in the embodiment depicted, the second gate structure 301 may include a second gate insulating layer 303, a second gate liner 305, a second gate conductive layer 307, a second bottom capping layer 309, and a second top capping layer 311.

With reference to FIG. 1, in the embodiment depicted, the second gate insulating layer 303 may be inwardly disposed in the peripheral area 105. The second gate insulating layer 303 may have a U-shaped cross-sectional profile. Top surfaces 303-1 of the second gate insulating layer 303 may be located at a vertical level lower than the vertical level of the top surfaces 203-1 of the first gate insulating layer 203. A width of the second gate insulating layer 303 may be referred to as the width W2 of the second gate structure 301. The width of the second gate insulating layer 303 may be greater than the width of the first gate insulating layer 203. In some embodiments, the bottom surface of the second gate insulating layer 303 may be flat. In some embodiments, the bottom surface of the second gate insulating layer 303 may be rounded to reduce defect density and reduce electric field concentration during the operation of the semiconductor device. The second gate insulating layer 303 may prevent junction leakage and prevent dopants in the plurality of second doped regions 403 from migrating into the second gate conductive layer 307. The second gate conductive layer 307 and the plurality of second doped regions 403 will be described in detail later. The second gate insulating layer 303 may be formed of a same material as the first gate insulating layer 203. The second gate insulating layer 303 may have a same thickness as the first gate insulating layer 203.

In some embodiments, the second gate insulating layer 303 may be a multilayer structure that includes, for example, one layer of silicon oxide and another layer of high-k dielectric material. The one layer of silicon oxide may be regarded as an interfacial layer (not shown in FIG. 1) disposed between the second gate insulating layer 303 and the substrate 101. The interfacial layer may have a thickness between about 7 angstroms and 12 angstroms. In some embodiments, the interfacial layer may have a thickness between about 8 angstroms and 10 angstroms. The interfacial layer may facilitate the formation of the second gate insulating layer 303 during fabrication of the semiconductor device.

In some embodiments, more than one second gate structures 301 may be disposed in the peripheral area 105 (not shown in FIG. 1). The second gate insulating layers 303 of some of the second gate structures 301 may have a first thickness and the second gate insulating layers 303 of some other of the second gate structures 301 may have a second thickness different from the first thickness. Different thicknesses of the second gate insulating layers 303 may result in different threshold voltages of the second gate structures 301 which may provide different functions; therefore, the applicability of the semiconductor device may be increased.

With reference to FIG. 1, in the embodiment depicted, the second gate liner 305 may be inwardly disposed on the second gate insulating layer 303. The second gate liner 305 may have a U-shaped cross-sectional profile. In the embodiment depicted, the second gate liner 305 may be formed of a same material as the first gate liner 205. The second gate liner 305 may have a same thickness as the first gate liner 205. The second gate liner 305 may have a width greater than a width of the first gate liner 205. The top surfaces 305-1 of the second gate liner 305 may be located at a vertical level lower than the vertical level of the top surfaces 205-1 of the first gate liner 205.

In some embodiments, the top surfaces 305-1 of the second gate liner 305 may be located at a vertical level higher than a vertical level of the top surfaces 303-1 of the second gate insulating layer 303. A difference between vertical levels of the top surfaces 303-1 of the second gate insulating layer 303 and the top surfaces 305-1 of the second gate liner 305 may be less than 25 angstroms. In some embodiments, the difference between vertical levels of the top surfaces 303-1 of the second gate insulating layer 303 and the top surfaces 305-1 of the second gate liner 305 may be less than 15 angstroms, or less than 5 angstroms. In some embodiments, the top surfaces 303-1 of the second gate insulating layer 303 may be located at a same vertical level as the top surfaces 305-1 of the second gate liner 305.

The second gate liner 305 may serve as a protective layer for its underlying structure (e.g., the second gate insulating layer 303) during formation of the second gate conductive layer 307. The second gate liner 305 may also serve as an adhesive layer between the second gate insulating layer 303 and the second gate conductive layer 307. The second gate liner 305 may be employed to prevent the second gate conductive layer 307 from flaking or spalling from the second gate insulating layer 303.

With reference to FIG. 1, in the embodiment depicted, the second gate conductive layer 307 may be disposed on the second gate liner 305 and in the peripheral area 105. A width of the second gate conductive layer 307 may be greater than a width of the first gate conductive layer 207. The second gate conductive layer 307 may be formed of a same material as the first gate conductive layer 207. A top surface 307-1 of the second gate conductive layer 307 may be located at a vertical level lower than the vertical level of the top surface 207-1 of the first gate conductive layer 207. The top surfaces 305-1 of the second gate liner 305 and the top surfaces 303-1 of the second gate insulating layer 303 may be respectively correspondingly disposed adjacent to two sides of the second gate conductive layer 307.

In some embodiments, a top surface 307-1 of the second gate conductive layer 307 may be located at a vertical level higher than the top surfaces 305-1 of the second gate liner 305 or the top surfaces 303-1 of the second gate insulating layer 303. A difference between vertical levels of the top surface 307-1 of the second gate conductive layer 307 and the top surfaces 305-1 of the second gate liner 305 may be less than 15 angstroms. In some embodiments, the difference between vertical levels of the top surface 307-1 of the second gate conductive layer 307 and the top surfaces 305-1 of the second gate liner 305 may be less than 10 angstroms, or less than 5 angstroms. In some embodiments, the top surface 307-1 of the second gate conductive layer 307 may be located at a same vertical level as the top surfaces 205-1 of the first gate liner 205 or the top surfaces 303-1 of the second gate insulating layer 303.

With reference to FIG. 1, in the embodiment depicted, the second bottom capping layer 309 may be disposed on the top surface 307-1 of the second gate conductive layer 307, the top surfaces 305-1 of the second gate liner 305, and the top surfaces 303-1 of the second gate insulating layer 303. The second bottom capping layer 309 may be disposed in the array area 103. A top surface 309-1 of the second bottom capping layer 309 may be even with the top surface of the substrate 101. The second bottom capping layer 309 may have a width greater than the width of the first bottom capping layer 209. The second bottom capping layer 309 may have a same width as the second gate insulating layer 303. In some embodiments, the second bottom capping layer 309 may be formed of a same material as the first bottom capping layer 209.

With reference to FIG. 1, in the embodiment depicted, the second top capping layer 311 may be disposed on the second bottom capping layer 309. In some embodiments, the second top capping layer 311 may have a same width as the second bottom capping layer 309. In some embodiments, the second top capping layer 311 may have a width less than the width of the second bottom capping layer 309. A vertical distance from the bottom surface of the second gate insulating layer 303 to the top surface 311-1 of the second top capping layer 311 may be referred to as the depth D2 of the second gate structure 301. The second top capping layer 311 may be formed of a same material as the first top capping layer 211.

With reference to FIG. 1, in the embodiment depicted, the plurality of second doped regions 403 may be disposed adjacent to sides of the second gate structure 301 and in the peripheral area 105. Top surfaces of the plurality of second doped regions 403 may be even with the top surface of the substrate 101. Specifically, the plurality of second doped regions 403 may be disposed adjacent to two sides of the second bottom capping layer 309. Bottom surfaces 403-1 of the second doped regions 403 may be located at a same vertical level as the top surface 307-1 of the second gate conductive layer 307. The plurality of second doped regions 403 may be doped with a dopant such as phosphorus, arsenic, antimony, or boron. In the embodiment depicted, the plurality of second doped regions 403 may be doped with boron and may have the first electrical type. In some embodiments, the plurality of second doped regions 403 may have a dopant concentration greater than a dopant concentration of the substrate 101.

With reference to FIG. 1, in the embodiment depicted, the plurality of fourth doped regions 407 may be disposed on the plurality of second doped regions 403 and on the substrate 101. The plurality of fourth doped regions 407 may be disposed adjacent to sides of the second top capping layer 311. Two adjacent fourth doped regions 407 may be electrically insulated by the second top capping layer 311 interposed therebetween. Top surfaces of the plurality of fourth doped regions 407 may be even with the top surface 311-1 of the second top capping layer 311. The plurality of fourth doped regions 407 may be formed of a same material as the plurality of third doped regions 405. The plurality of fourth doped regions 407 may be doped with a same dopant as the plurality of third doped regions 405 and may have the second electrical type. In some embodiments, the plurality of fourth doped regions 407 may have a dopant concentration greater than the dopant concentration of the plurality of second doped regions 403.

Optionally, a plurality of silicide layers (not shown in FIG. 1) may be disposed on the plurality of third doped regions 405 and the plurality of fourth doped regions 407 for ohmic contact. The plurality of silicide layers may be formed of, for example, titanium silicide, nickel silicide, nickel platinum silicide, tantalum silicide, or cobalt silicide. The plurality of silicide layers may have a thickness between about 2 nm and about 20 nm.

With reference to FIG. 1, in the embodiment depicted, the first insulating layer 601 may be disposed on the substrate 101 and may surround the first top capping layer 211, the second top capping layer 311, the plurality of third doped regions 405, and the plurality of fourth doped regions 407. Top surfaces of the first insulating layer 601 may be even with the top surfaces 211-1 of the first top capping layer 211, the top surface 311-1 of the second top capping layer 311, the top surfaces of the plurality of third doped regions 405, and the top surfaces of the plurality of fourth doped regions 407. The first insulating layer 601 may be formed of a same material as the first top capping layer 211 and the second top capping layer 311.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
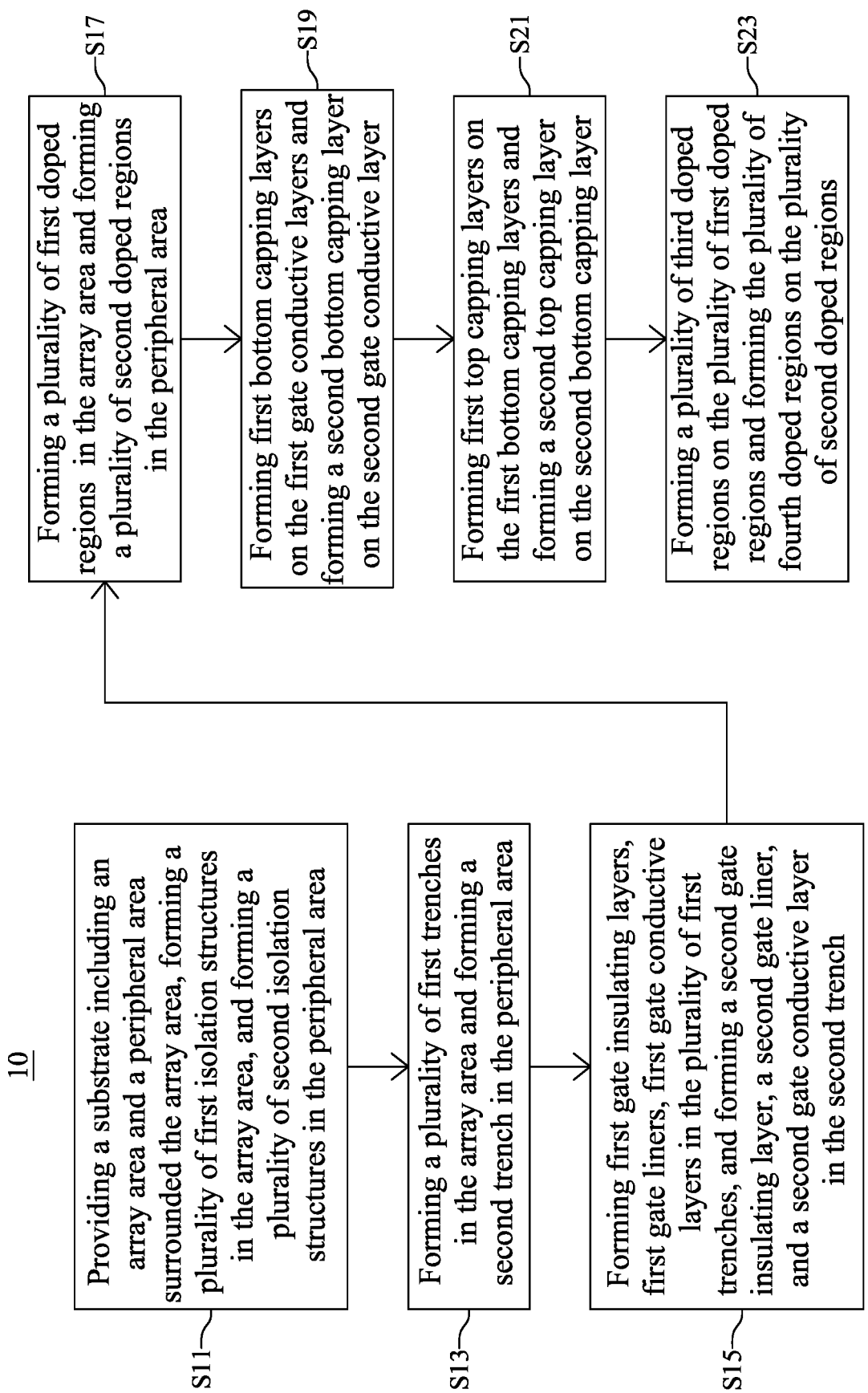
FIG. 2 illustrates, in a flowchart diagram form, a method for fabricating a semiconductor device in accordance with one embodiment of the present disclosure.

FIG. 2 illustrates, in a flowchart diagram form, a method 10 for fabricating a semiconductor device in accordance with one embodiment of the present disclosure. FIGS. 3 to 21 illustrate, in schematic cross-sectional view diagrams, a flow for fabricating the semiconductor device in accordance with one embodiment of the present disclosure.

Figure 3:
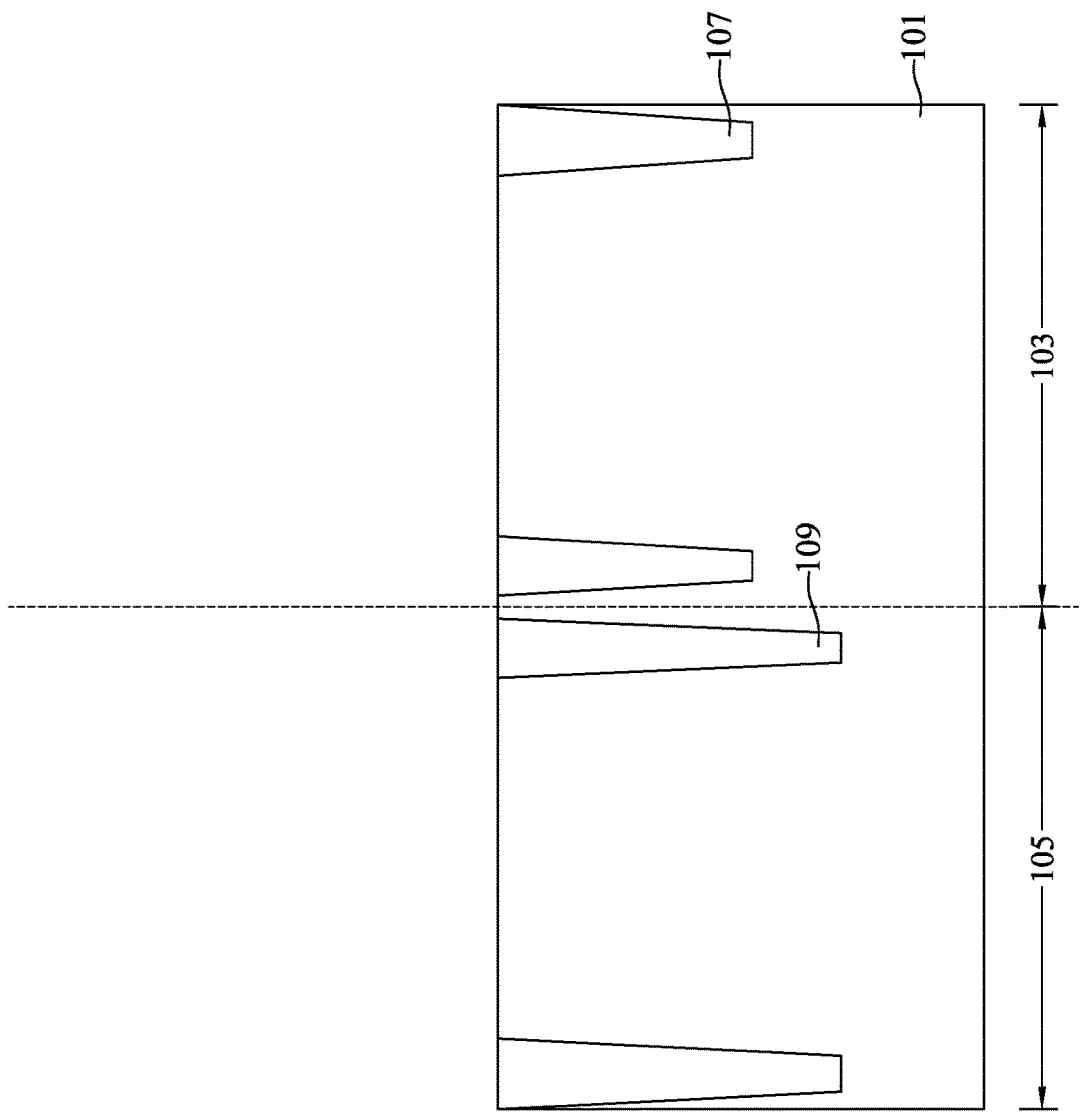
FIGS. 3 to 21 illustrate, in schematic cross-sectional view diagrams, a flow for fabricating the semiconductor device in accordance with one embodiment of the present disclosure.

With reference to FIGS. 2 and 3, at step S11, in the embodiment depicted, a substrate 101 including an array area 103 and a peripheral area 105 surrounding the array area 103 may be provided, and a plurality of first isolation structures 107 may be formed in the array area 103 and a plurality of second isolation structures 109 may be formed in the peripheral area 105.

With reference to FIG. 3, in some embodiments, a series of first deposition processes may be performed to deposit a pad oxide layer (not shown in FIG. 3) and a pad nitride layer (not shown in FIG. 3) on the substrate 101. A first photolithography process may be performed to define positions of the plurality of first isolation structures 107. After the first photolithography process, a first etch process, such as an anisotropic dry etch process, may be performed to form trenches penetrating through the pad oxide layer, the pad nitride layer, and the substrate 101. An insulating material may be deposited in the trenches and a planarization process, such as chemical mechanical polishing, may be subsequently performed to remove excess filling material until the substrate 101 is exposed. The insulating material may be, for example, silicon oxide, silicon nitride, silicon oxynitride, silicon nitride oxide, or fluoride-doped silicate. Subsequently, the plurality of second isolation structures 109 may be formed in the peripheral area 105 with a procedure similar to the fabrication of the plurality of first isolation structures 107. The plurality of second isolation structures 109 may have a depth greater than that of the plurality of first isolation structures 107. In some embodiments, the plurality of first isolation structures 107 and the plurality of second isolation structures 109 may be concurrently formed. The plurality of first isolation structures 107 may have a same depth as the plurality of second isolation structures 109.

Figure 4:
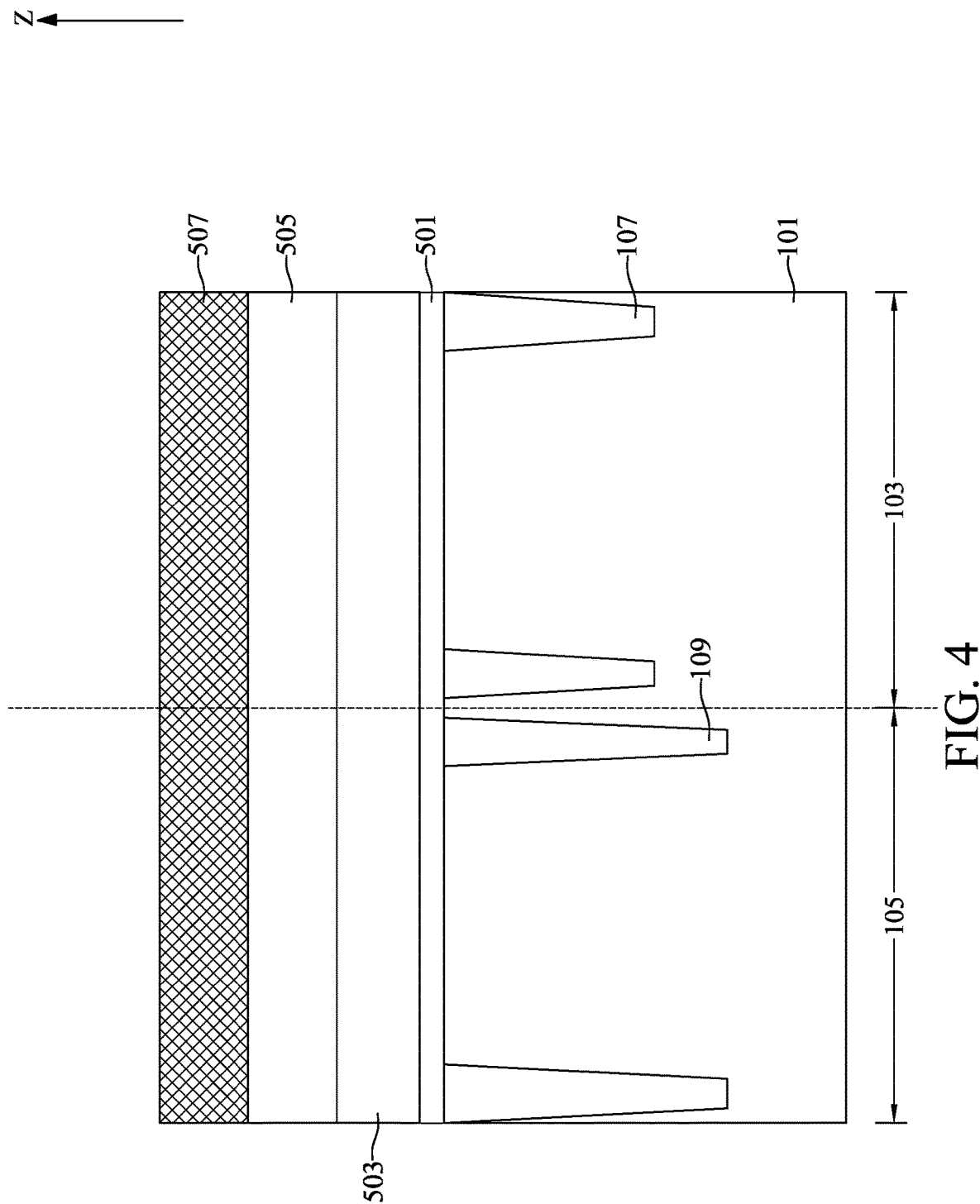

With reference to FIG. 2 and FIGS. 4 to 7, at step S13, in the embodiment depicted, a plurality of first trenches 515 and a second trench 517 may be concurrently formed in the array area 103 and the peripheral area 105, respectively. With reference to FIG. 4, a series of deposition processes may be performed over the substrate 101 to form, from bottom to top, a buffer layer 501, a bottom sacrificing layer 503, and a top sacrificing layer 505.

The buffer layer 501 may be formed of, for example, silicon oxide, carbon-doped oxide, carbon incorporated silicon oxide, ornithine decarboxylase, or nitrogen-doped silicon carbide. The buffer layer 501 may protect against contamination and mitigate stress at the interface between the substrate 101 and the bottom sacrificing layer 503. The buffer layer 501 may also serve as an etch stop layer for subsequent etch processes. The bottom sacrificing layer 503 may be formed of, for example, polysilicon. The top sacrificing layer 505 may be formed of, for example, silicon nitride. A photolithography process may be performed to form a first mask layer 507 on the top sacrificing layer 505. The first mask layer 507 may be formed of, for example, a photoresist material. The top sacrificing layer 505 may be employed as an anti-reflective coating layer to minimize the optical reflection of the radiation used to expose the first mask layer 507 coated on the top sacrificing layer 505.

Figure 5:
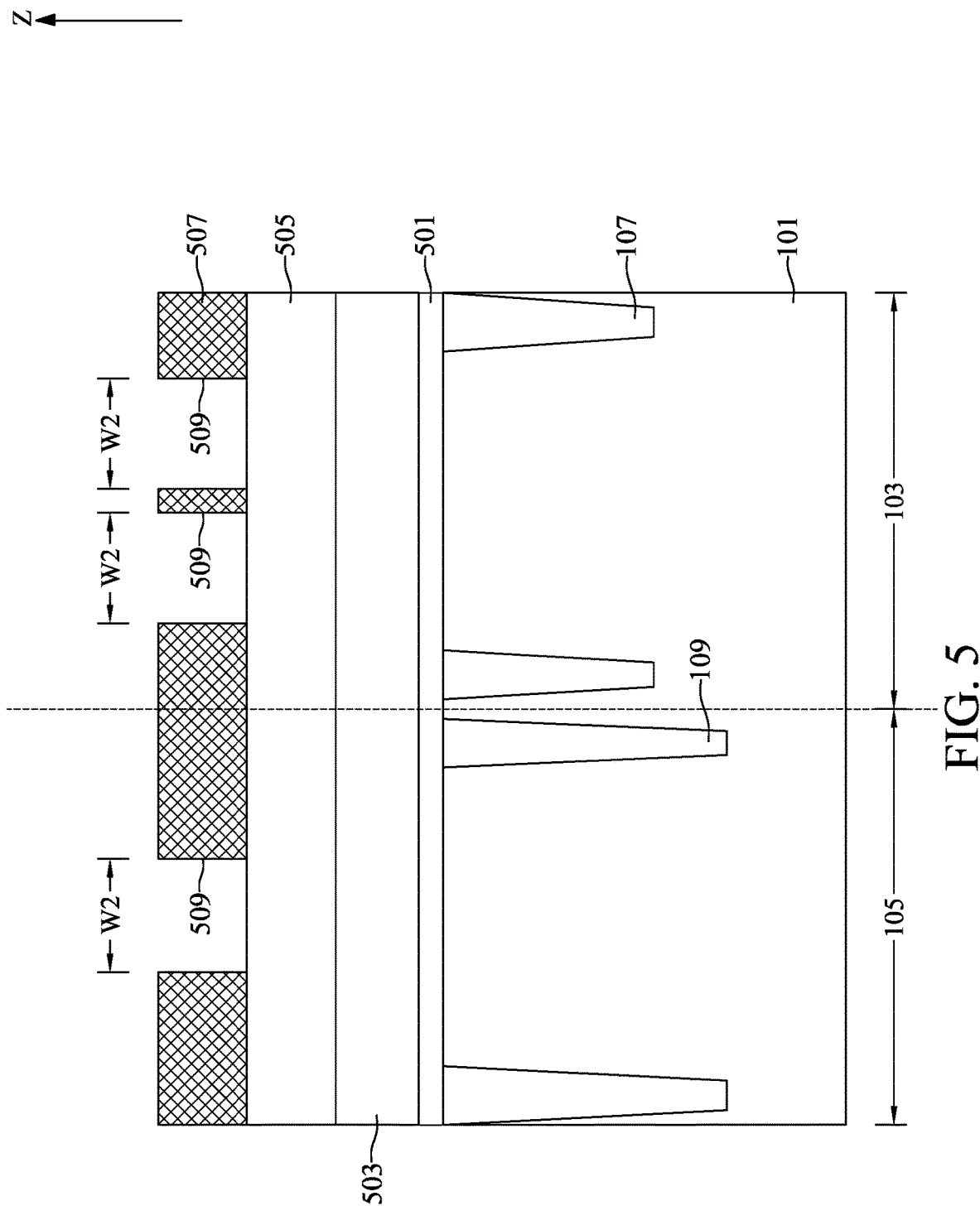

With reference to FIG. 5, after the developing of the first mask layer 507, a plurality of first openings 509 may be formed so as to penetrate the first mask layer 507 and to expose portions of the top surface of the top sacrificing layer 505. It should be noted that the plurality of first openings 509 may have a same width W2, including the first openings 509 above the array area 103 and the first openings 509 above the peripheral area 105. More first openings 509 are formed above the array area 103, and the array area 103 may be a dense area. The plurality of first openings 509 may define positions of the plurality of first trenches 515 and the second trench 517.

Figure 6:
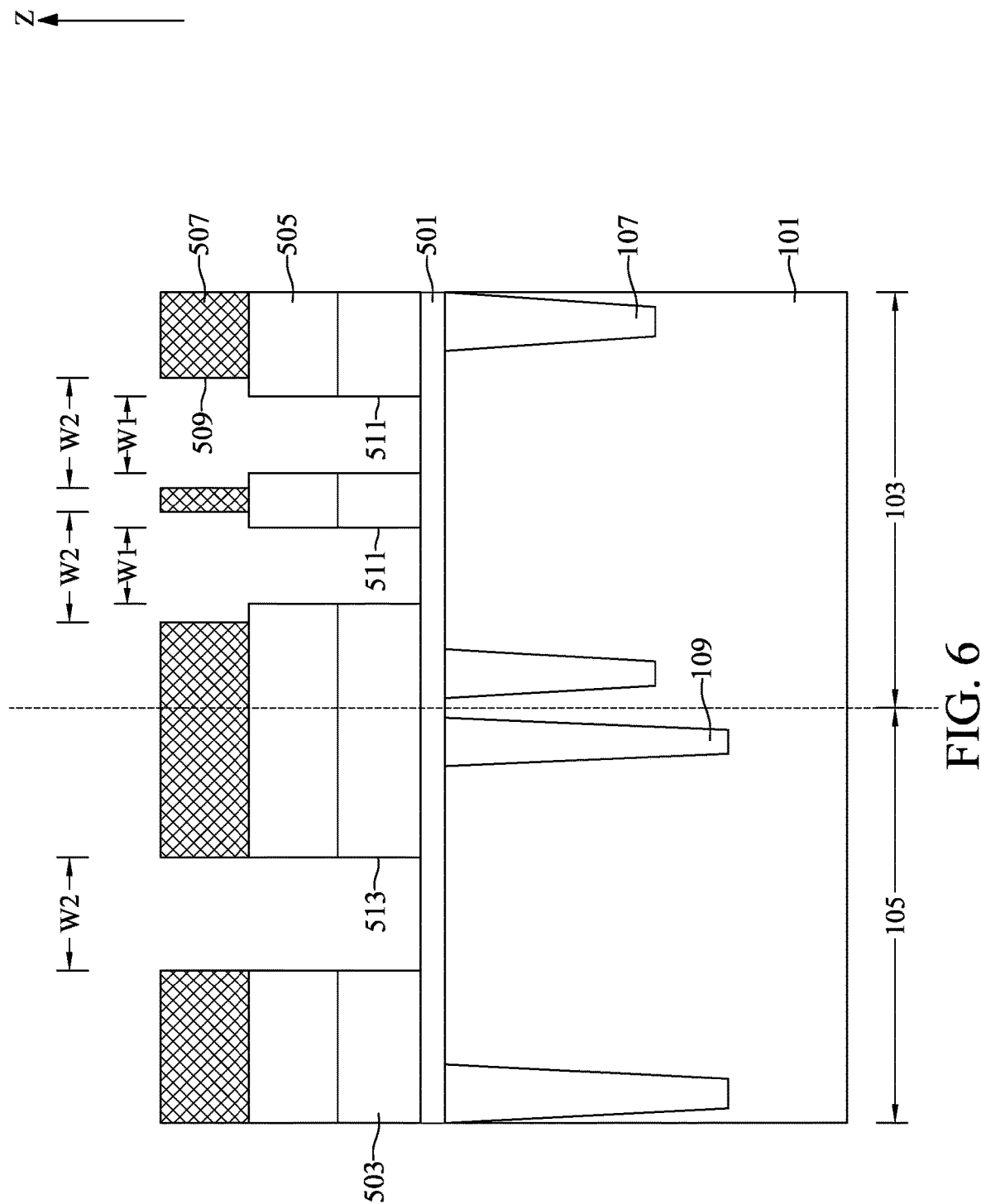
Figure 7:
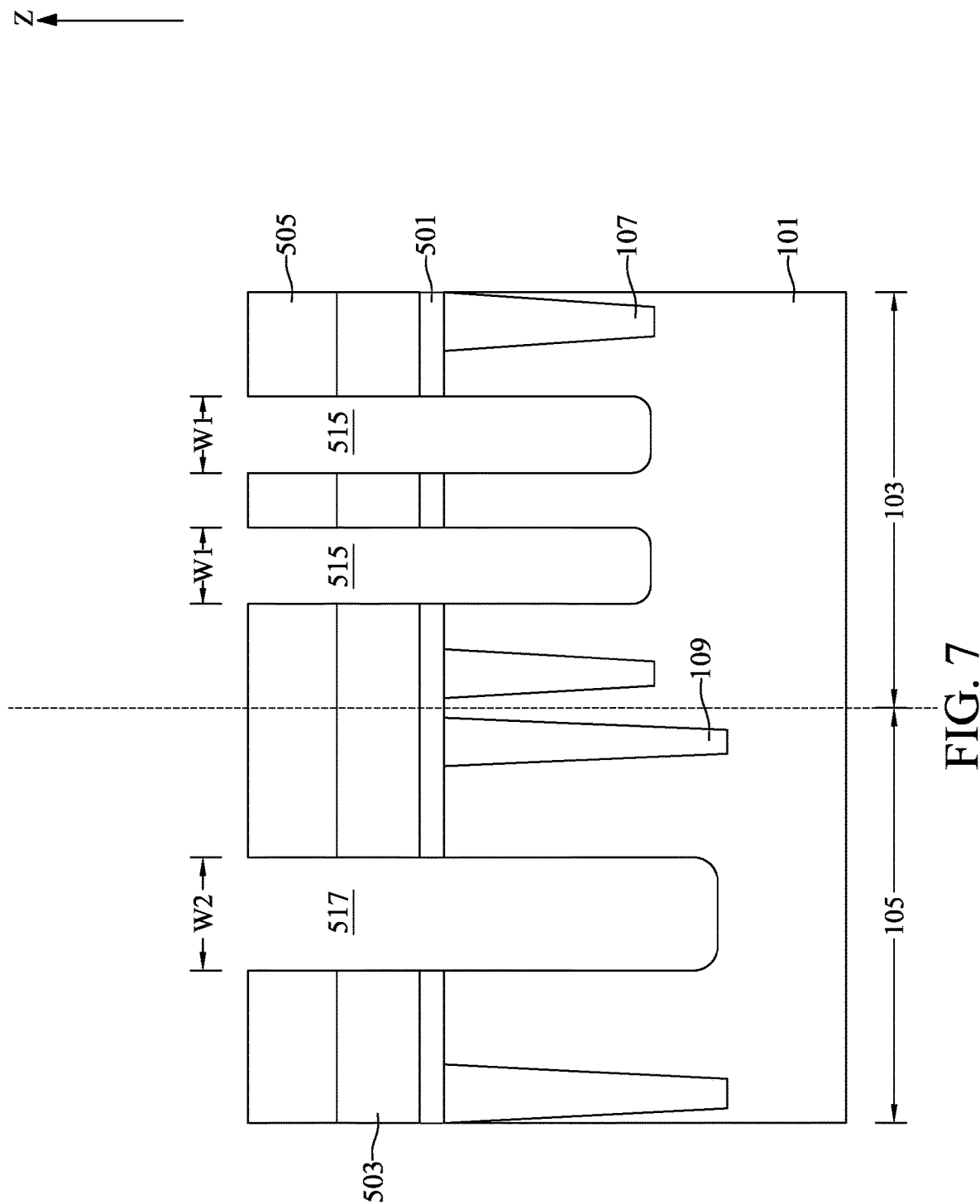

With reference to FIG. 6, a first etch process, such as an anisotropic dry etch process, may be performed to remove portions of the top sacrificing layer 505 and portions of the bottom sacrificing layer 503 and to form a plurality of second openings 511 above the array area 103 and a third opening 513 above the peripheral area 105. Due to the loading effect, the plurality of second openings 511 may have a width W1 less than a width W2 of the third opening 513, and a depth of the second trench 517 may be greater than a depth of the plurality of first trenches 515. With reference to FIG. 7, a second etch process, such as an anisotropic dry etch process, may be performed to remove portions of the buffer layer 501 and portions of the substrate 101, and thereby form the plurality of first trenches 515 in the array area 103 and the second trench 517 in the peripheral area 105. The width of the plurality of first trenches 515 may be derived from the width W1 of the plurality of second openings 511. The width of the second trench 517 may be derived from the width W2 of the third opening 513.

Figure 8:
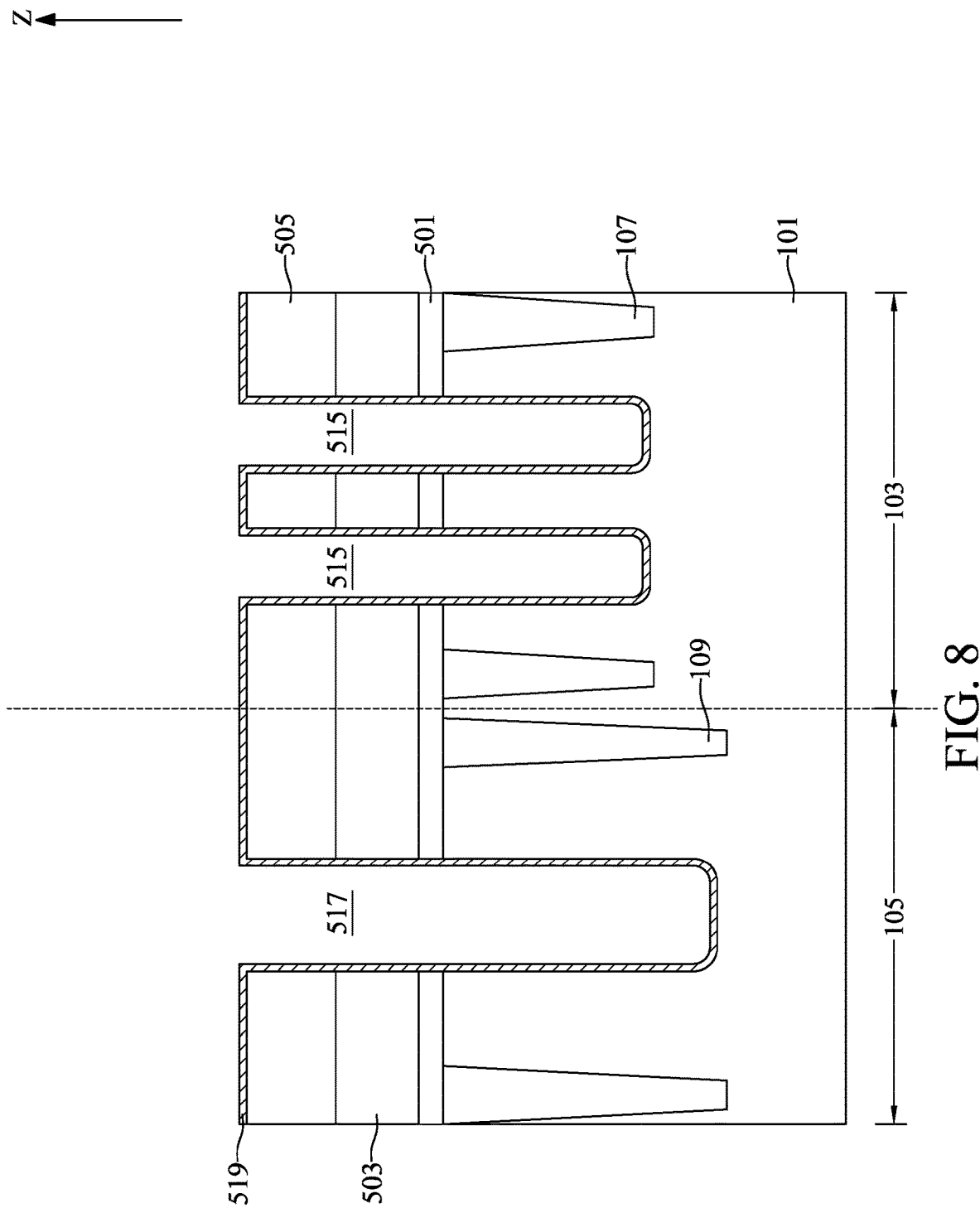

With reference to FIG. 2 and FIGS. 8 to 15, at step S15, in the embodiment depicted, first gate insulating layers 203, first gate liners 205, and first gate conductive layers 207 may be respectively correspondingly formed in the plurality of first trenches 515, and a second gate insulating layer 303, a second gate liner 305, and a second gate conductive layer 307 may be formed in the second trench 517. With reference to FIG. 8, a layer of gate insulating material 519 may be formed over the top surfaces of the top sacrificing layer 505, in the plurality of first trenches 515, and in the second trench 517. The gate insulating material 519 may be, for example, silicon oxide or a high-k dielectric material such as metal oxide, metal nitride, metal silicate, transition metal-oxide, transition metal-nitride, transition metal-silicate, oxynitride of metal, metal aluminate, zirconium silicate, or zirconium aluminate. The layer of gate insulating material 519 may have a thickness between about 13 angstroms and about 20 angstroms. The layer of gate insulating material 519 may be formed by chemical vapor deposition, atomic layer deposition, or the like.

Figure 9:
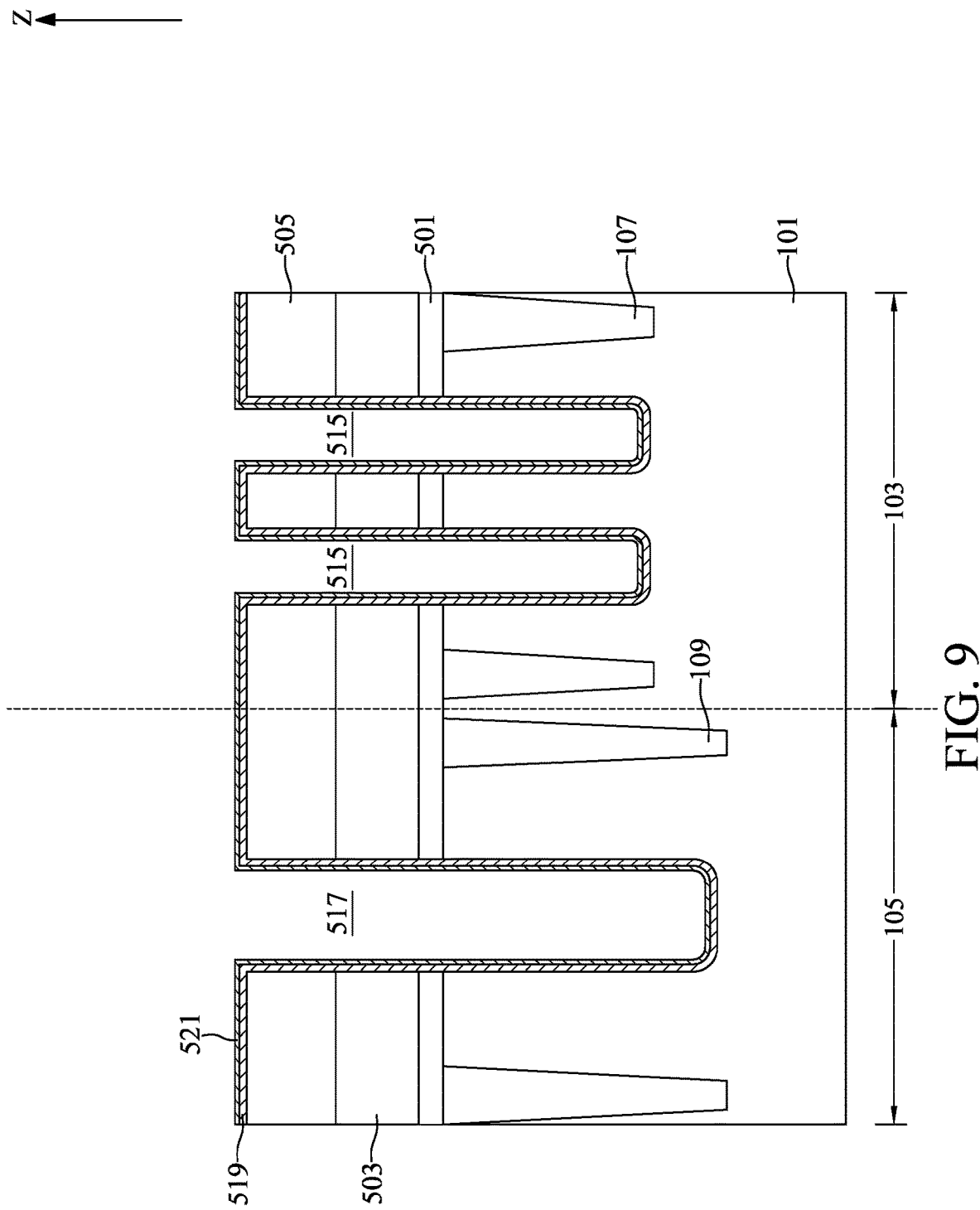

With reference to FIG. 9, a layer of gate liner material 521 may be formed on the layer of gate insulating material 519 and may not fill the plurality of first trenches 515 and the second trench 517. The gate liner material 521 may be, for example, titanium nitride, tantalum nitride, titanium, tantalum, titanium tungsten, the like, or a combination thereof. The layer of gate liner material 521 may have a thickness between about 10 angstroms and about 15 angstroms. The layer of gate liner material 521 may be formed by chemical vapor deposition, physical vapor deposition, atomic layer deposition, or the like.

Figure 10:
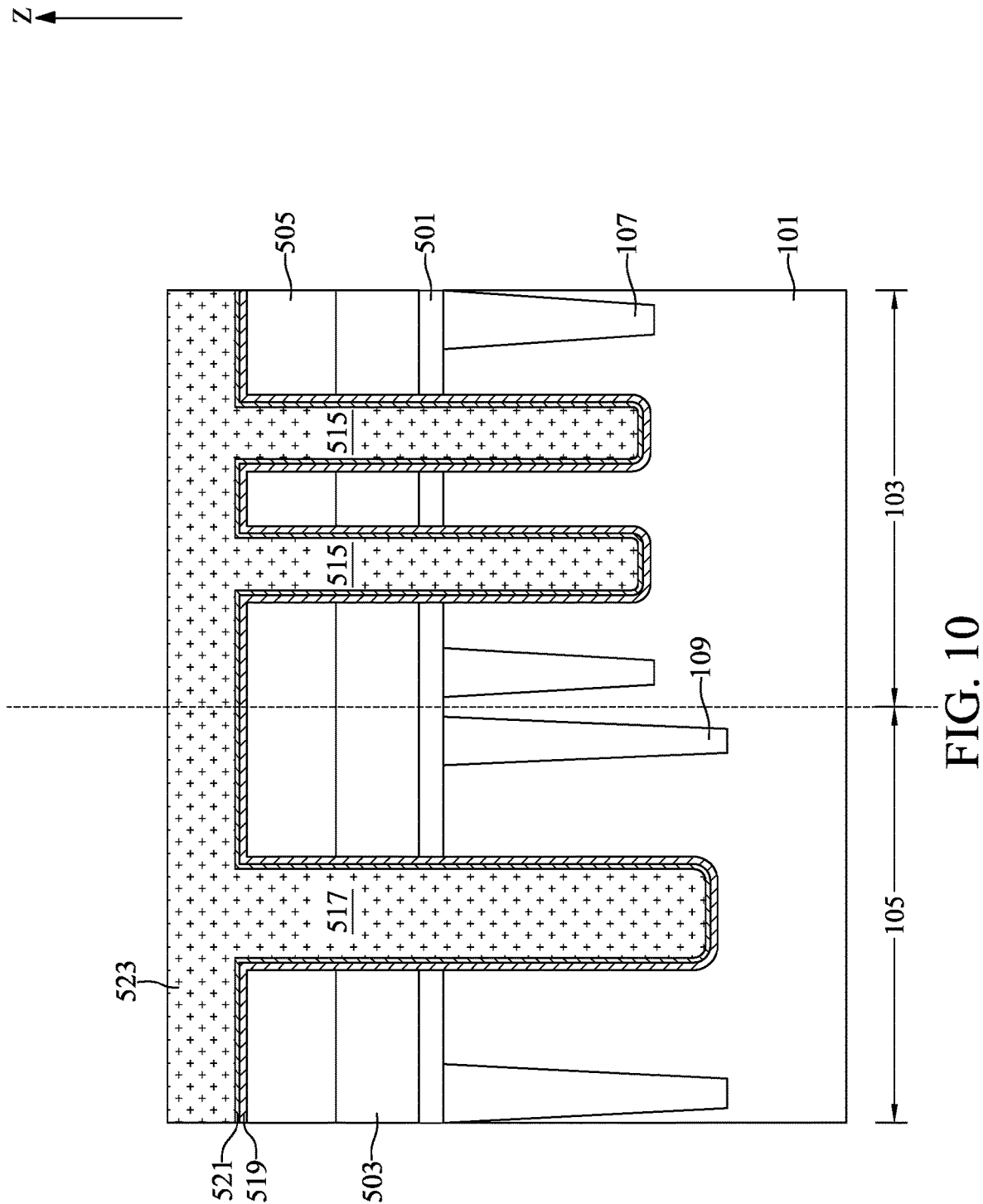
Figure 11:
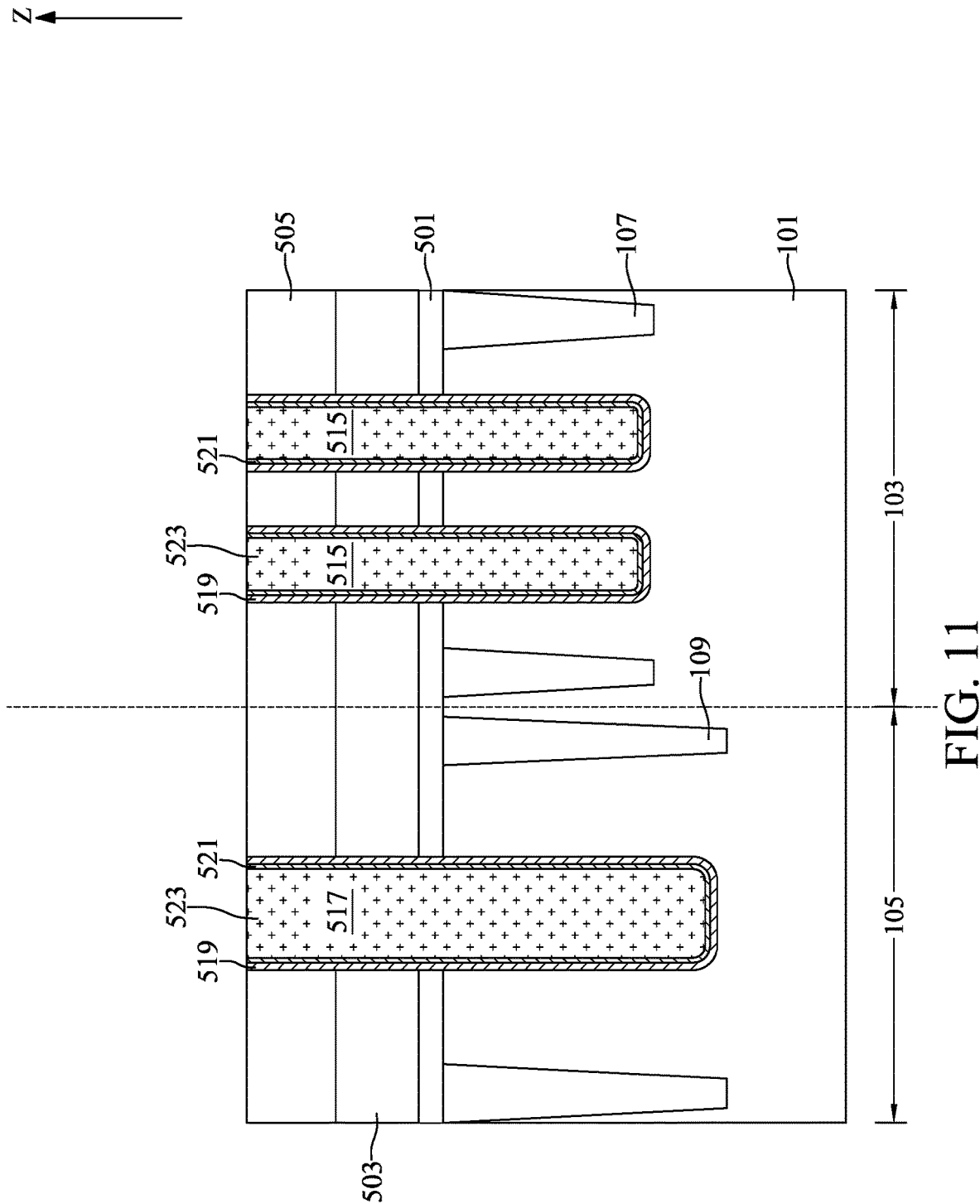

With reference to FIG. 10, a gate conductive material 523 such as tungsten, aluminum, titanium, or copper, may be deposited over the intermediate semiconductor device to fill the plurality of first trenches 515 and the second trench 517. With reference to FIG. 11, a planarization process, such as chemical mechanical polishing, may be performed until the top surface of the top sacrificing layer 505 is exposed to remove excess material and provide a substantially flat surface for subsequent processing steps.

Figure 12:
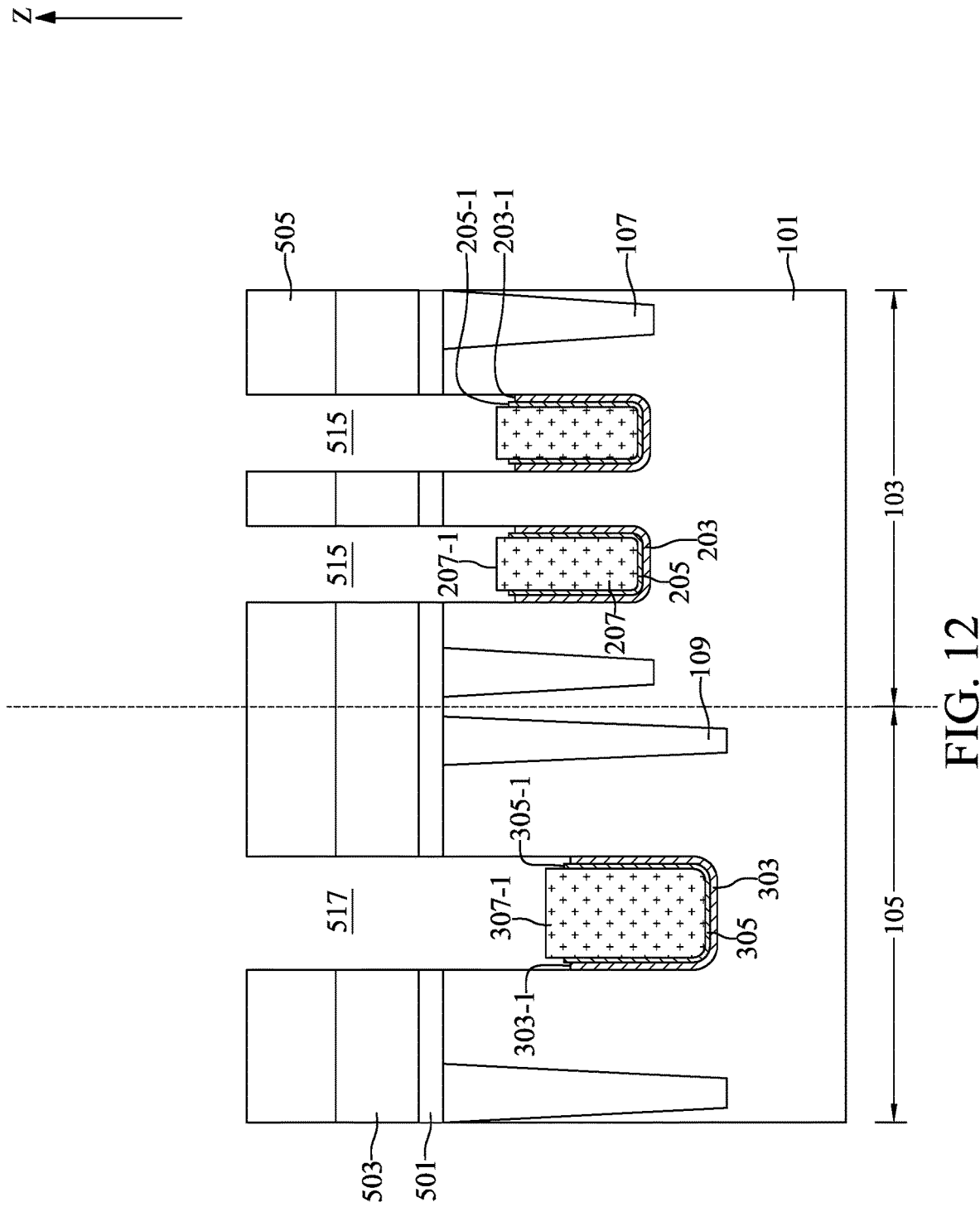

With reference to FIG. 12, one or more etch-back processes may be performed to recess the gate conductive material 523, the layer of gate insulating material 519, and the layer of gate liner material 521. Concurrently, the first gate insulating layers 203, the first gate liners 205, and the first gate conductive layers 207 are respectively correspondingly formed in the plurality of first trenches 515, and the second gate insulating layer 303, the second gate liner 305, the second gate conductive layer 307 are formed in the second trench 517. Top surfaces 203-1 of the first gate insulating layers 203, top surfaces 205-1 of the first gate liners 205, a top surface 207-1 of the first gate conductive layer 207, top surfaces 303-1 of the second gate insulating layer 303, top surfaces 305-1 of the second gate liner 305, and a top surface 307-1 of the second gate conductive layer 307 may be located at a vertical level lower than the vertical level of the top surface of the substrate 101.

Figure 13:
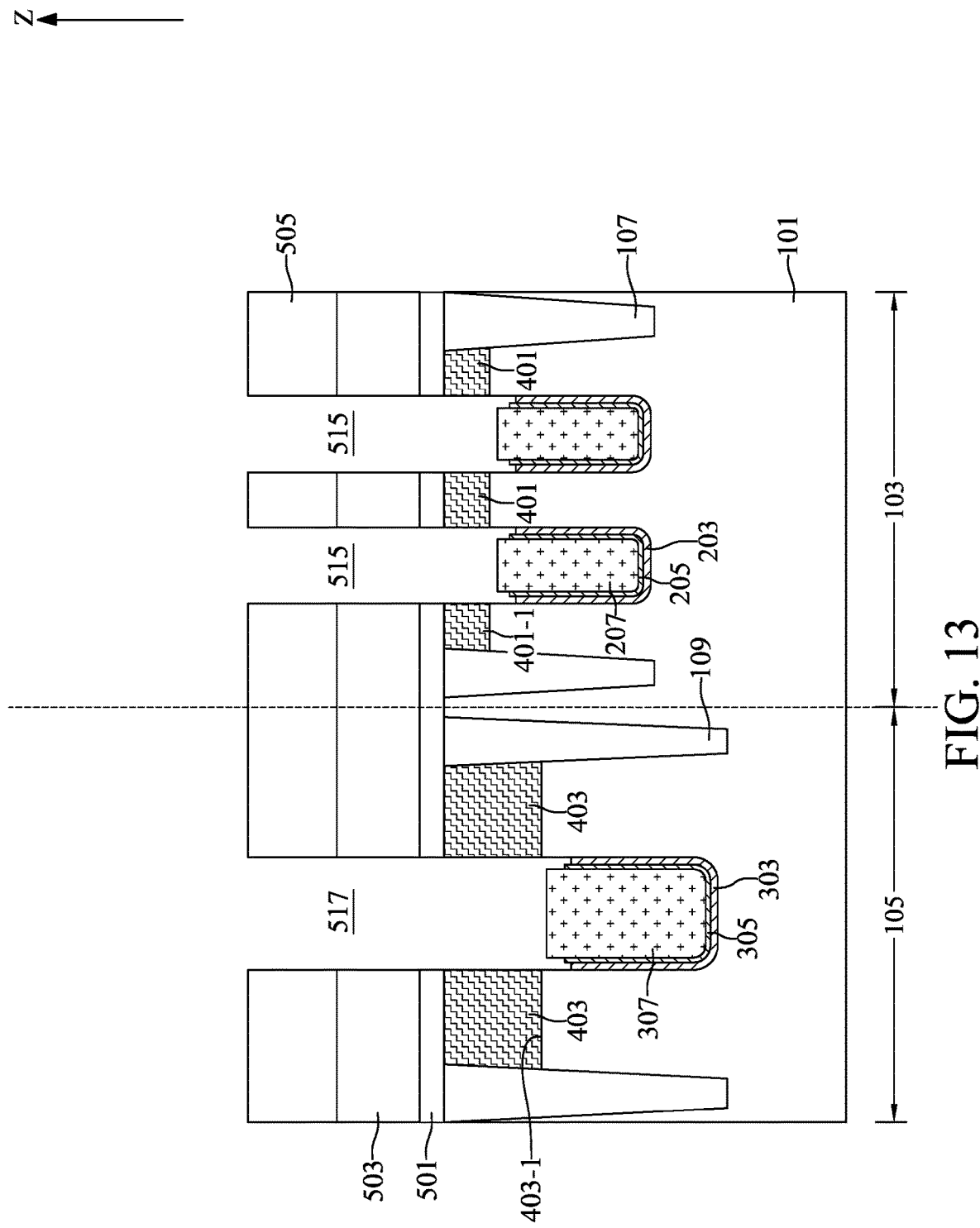

With reference to FIGS. 2 and 13, at step S17, in the embodiment depicted, a plurality of first doped regions 401 and a plurality of second doped regions 403 may be formed in the array area 103 and the peripheral area 105, respectively. A tilt angle implantation process may be performed to introduce dopants such as boron into the array area 103 and the peripheral area 105 and concurrently form the plurality of first doped regions 401 in the array area 103 and the plurality of second doped regions 403 in the peripheral area 105. Bottom surfaces 401-1 of the first doped regions 401 may be aligned with the top surface 207-1 of the first gate conductive layer 207 and bottom surfaces 403-1 of the second doped regions 403 may be aligned with the top surface 307-1 of the second gate conductive layer 307. An annealing process may be performed to activate the plurality of first doped regions 401 and the plurality of second doped regions 403. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 14:
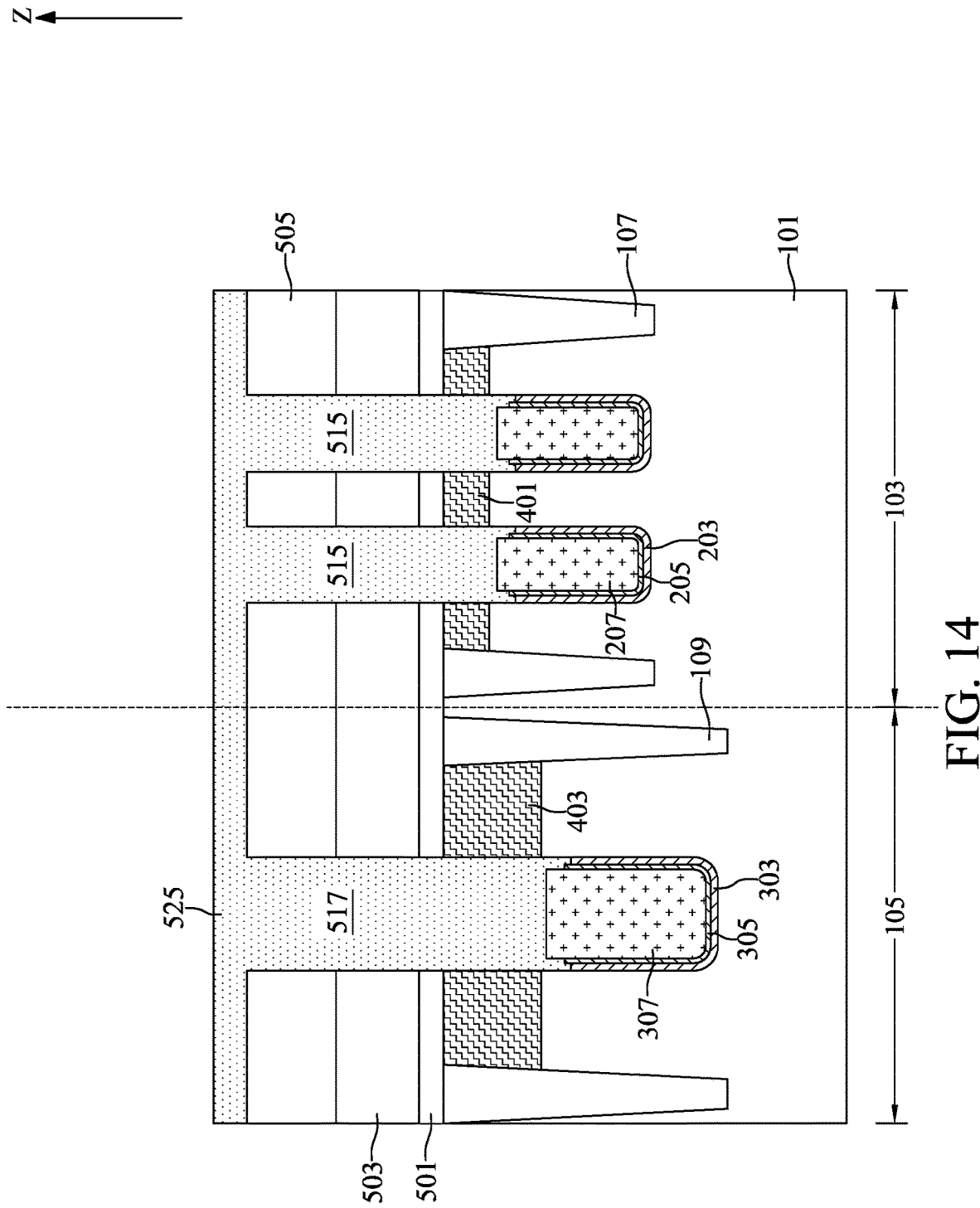
Figure 15:
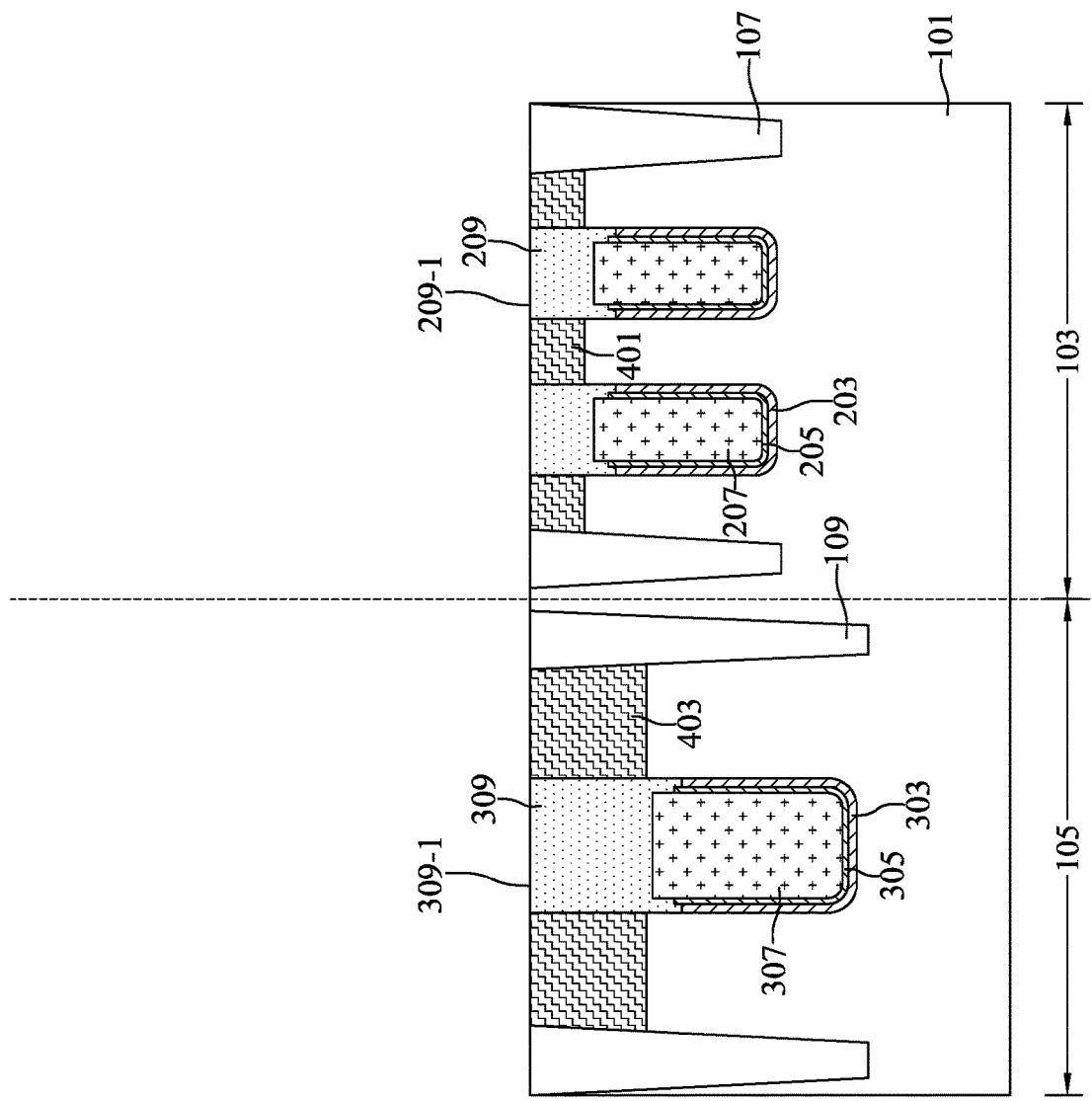

With reference to FIGS. 2, 14, and 15, at step S19, in the embodiment depicted, first bottom capping layers 209 may be formed on the first gate conductive layers 207 and a second bottom capping layer 309 may be formed on the second gate conductive layer 307. With reference to FIG. 14, a first insulating material 525 may be deposited over the intermediate semiconductor device to fill the plurality of first trenches 515 and the second trench 517. The first insulating material 525 may be, for example, silicon oxide or a high-k dielectric material. With reference to FIG. 15, a planarization process, such as chemical mechanical polishing, may be performed until the top surface of the substrate 101 is exposed to remove excess material, provide a substantially flat surface for subsequent processing steps, and conformally form the first bottom capping layers 209 on the first gate conductive layers 207 and the second bottom capping layer 309 on the second gate conductive layer 307.

Figure 16:
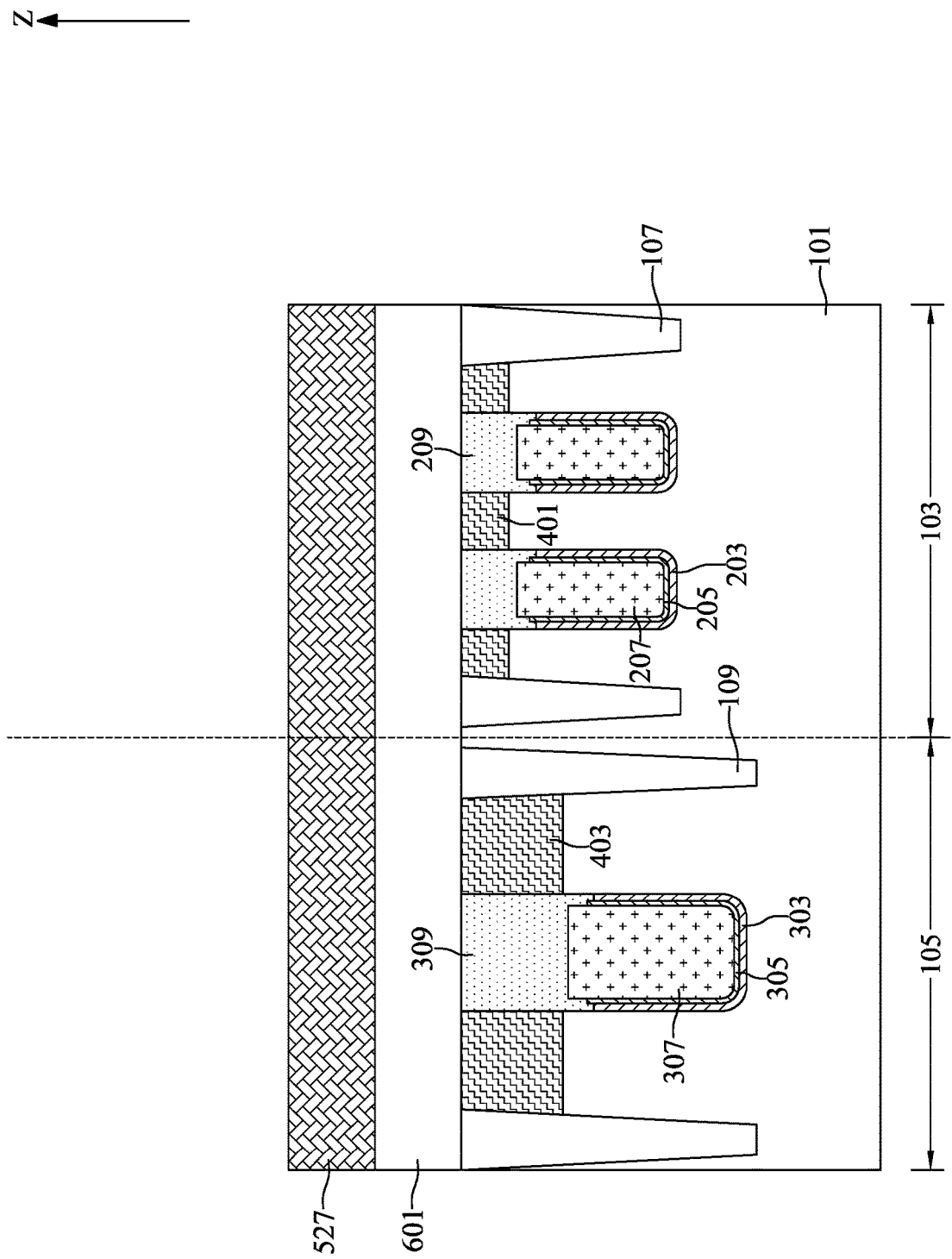

With reference to FIG. 2 and FIGS. 16 to 18, at step S21, in the embodiment depicted, first top capping layers 211 may be respectively correspondingly formed on the first bottom capping layers 209 and a second top capping layer 311 may be formed on the second bottom capping layer 309. With reference to FIG. 16, a first insulating layer 601 may be formed on the substrate 101. The first insulating layer 601 may be formed of, for example, silicon oxide or a low-k dielectric material. A photolithography process may be performed to form a second mask layer 527 on the first insulating layer 601. The second mask layer 527 may be formed of, for example, a photoresist material.

Figure 17:
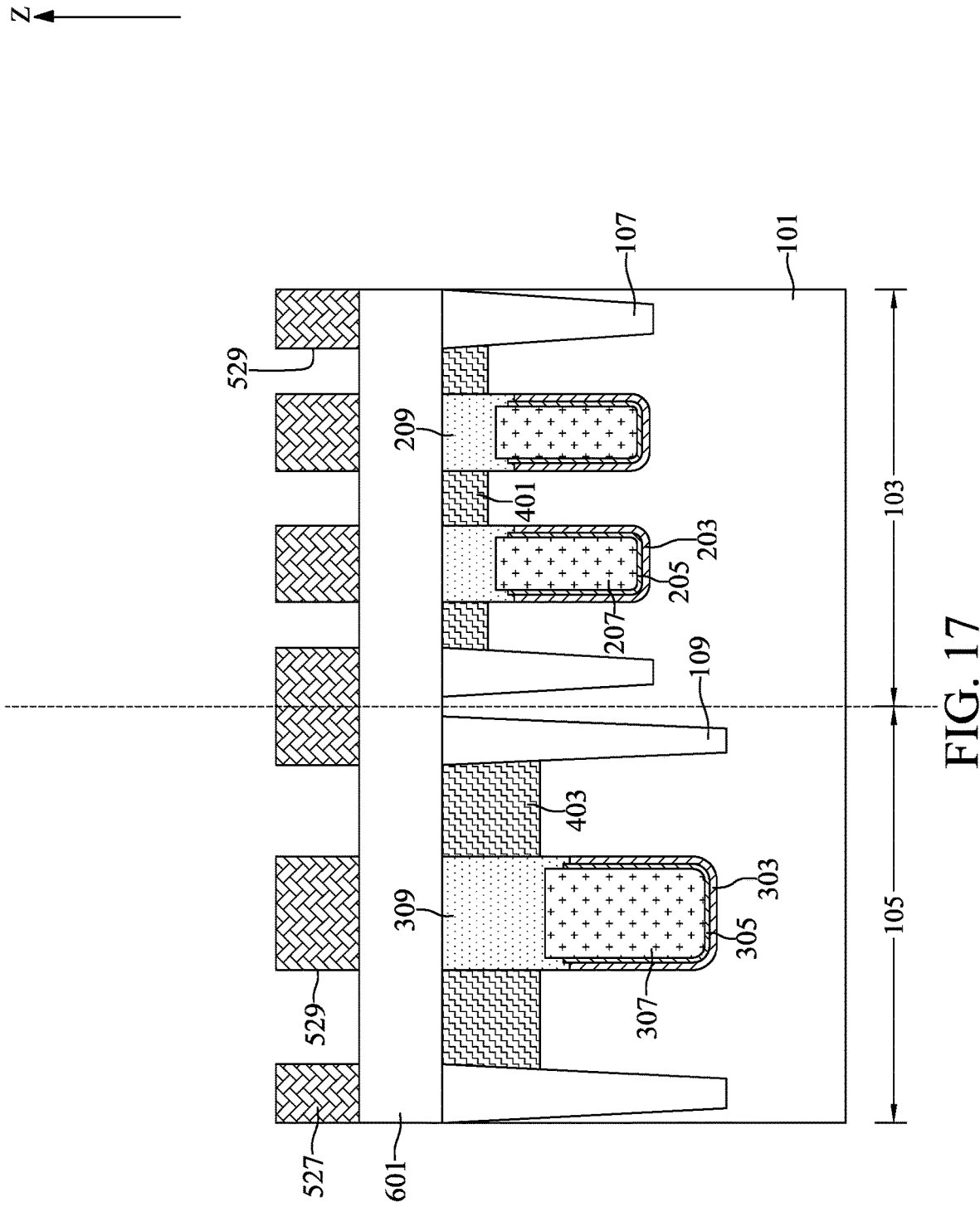

With reference to FIG. 17, after the developing of the second mask layer 527, a plurality of third openings 529 may be formed so as to penetrate the second mask layer 527 and thereby expose portions of the top surface of the first insulating layer 601. In some embodiments, widths of the plurality of third openings 529 formed above the array area 103 may be less than widths of the plurality of third openings 529 formed above the peripheral area 105. The plurality of third openings 529 may define the positions of the first top capping layer 211 and the second top capping layer 311.

Figure 18:
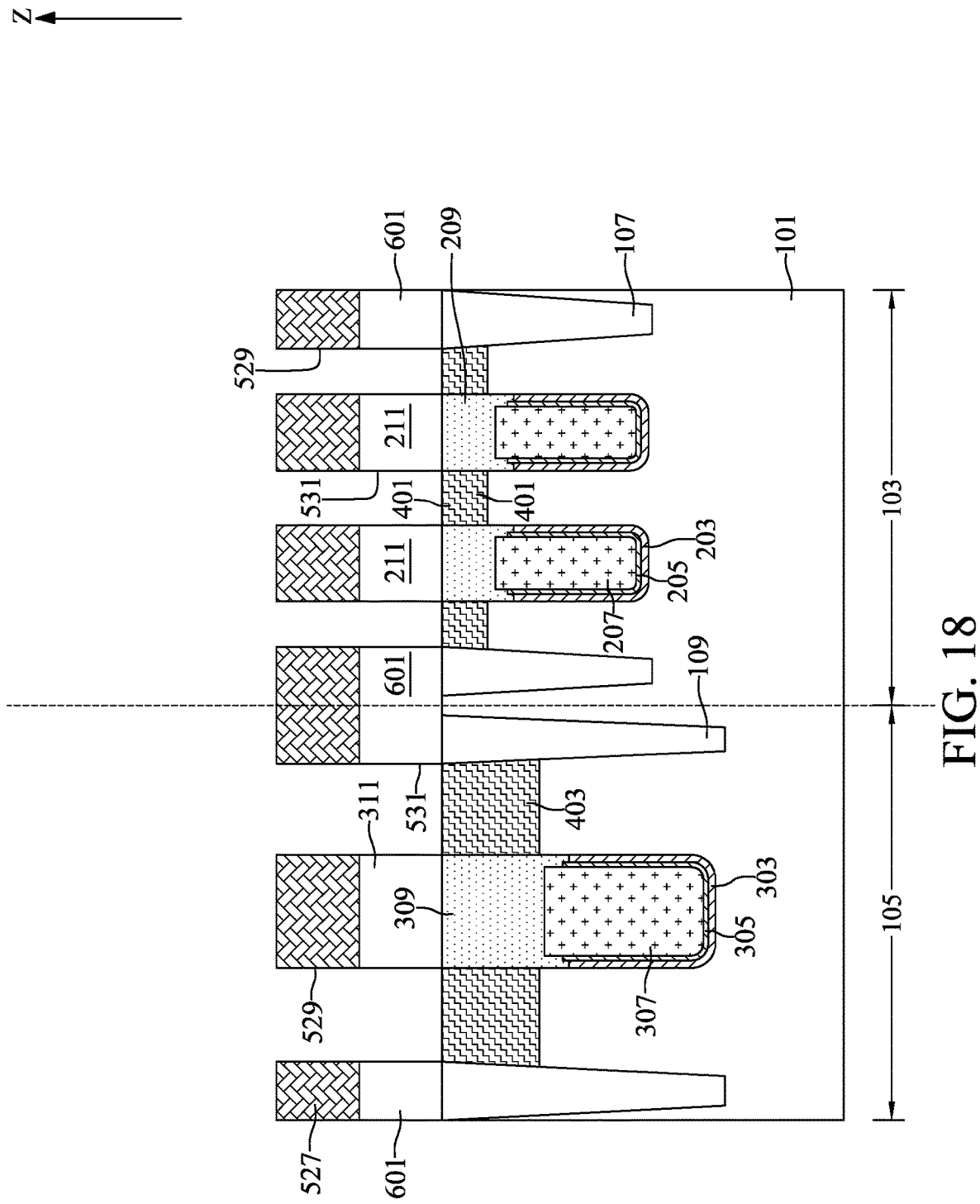

With reference to FIG. 18, an etch process, such as an anisotropic dry etch process, may be performed to remove portions of the first insulating layer 601 and form a plurality of fourth openings 531 above the array area 103 and the peripheral area 105. The etch process may also divide the first insulating layer 601 into a plurality of first insulating layers 601. The plurality of first insulating layers 601 formed on the first bottom capping layer 209 may be referred to as the first top capping layer 211. The plurality of first insulating layers 601 formed on the second bottom capping layer 309 may be referred to as the second top capping layer 311.

Figure 19:
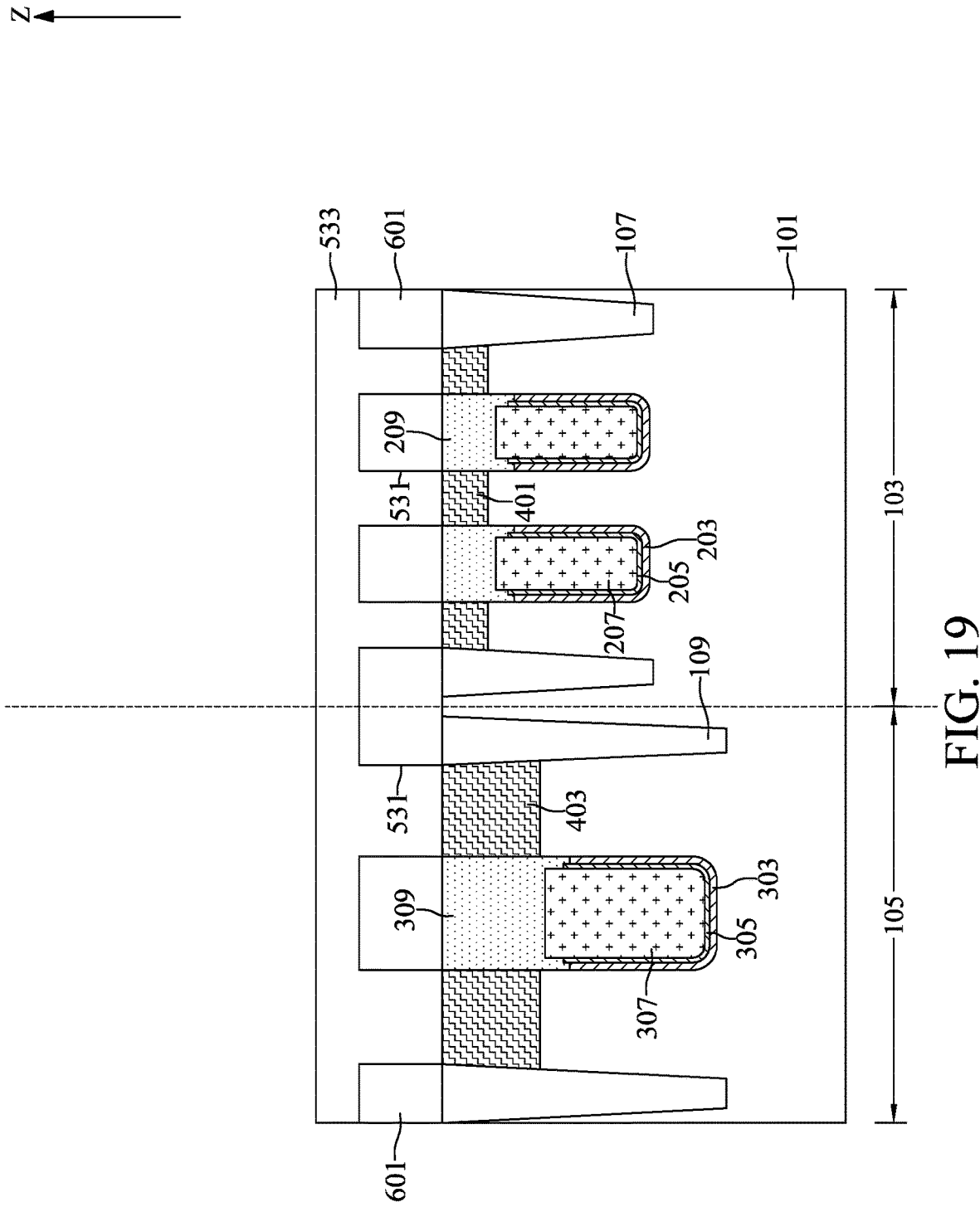

With reference to FIG. 2 and FIGS. 19 to 21, at step S23, in the embodiment depicted, a plurality of third doped regions 405 may be formed on the plurality of first doped regions 401, and the plurality of fourth doped regions 407 may be formed on the plurality of second doped regions 403. With reference to FIG. 19, a semiconductor material 533 may be formed over the intermediate semiconductor device and fill the plurality of fourth openings 531. The semiconductor material 533 may be, for example, silicon, germanium, silicon germanium, silicon carbon, silicon germanium carbon, gallium, gallium arsenic, indium arsenic, or indium phosphorus.

Figure 20:
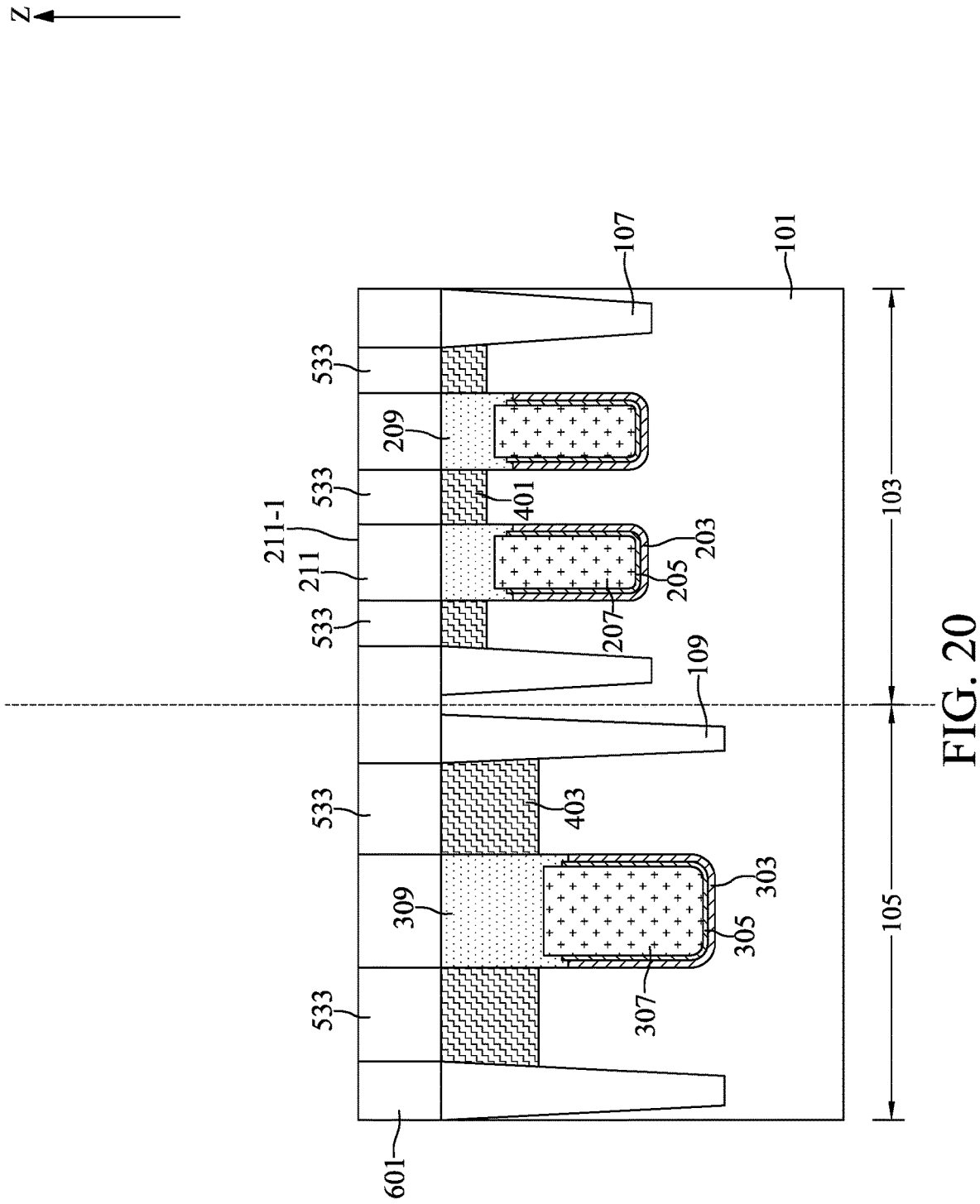
Figure 21:
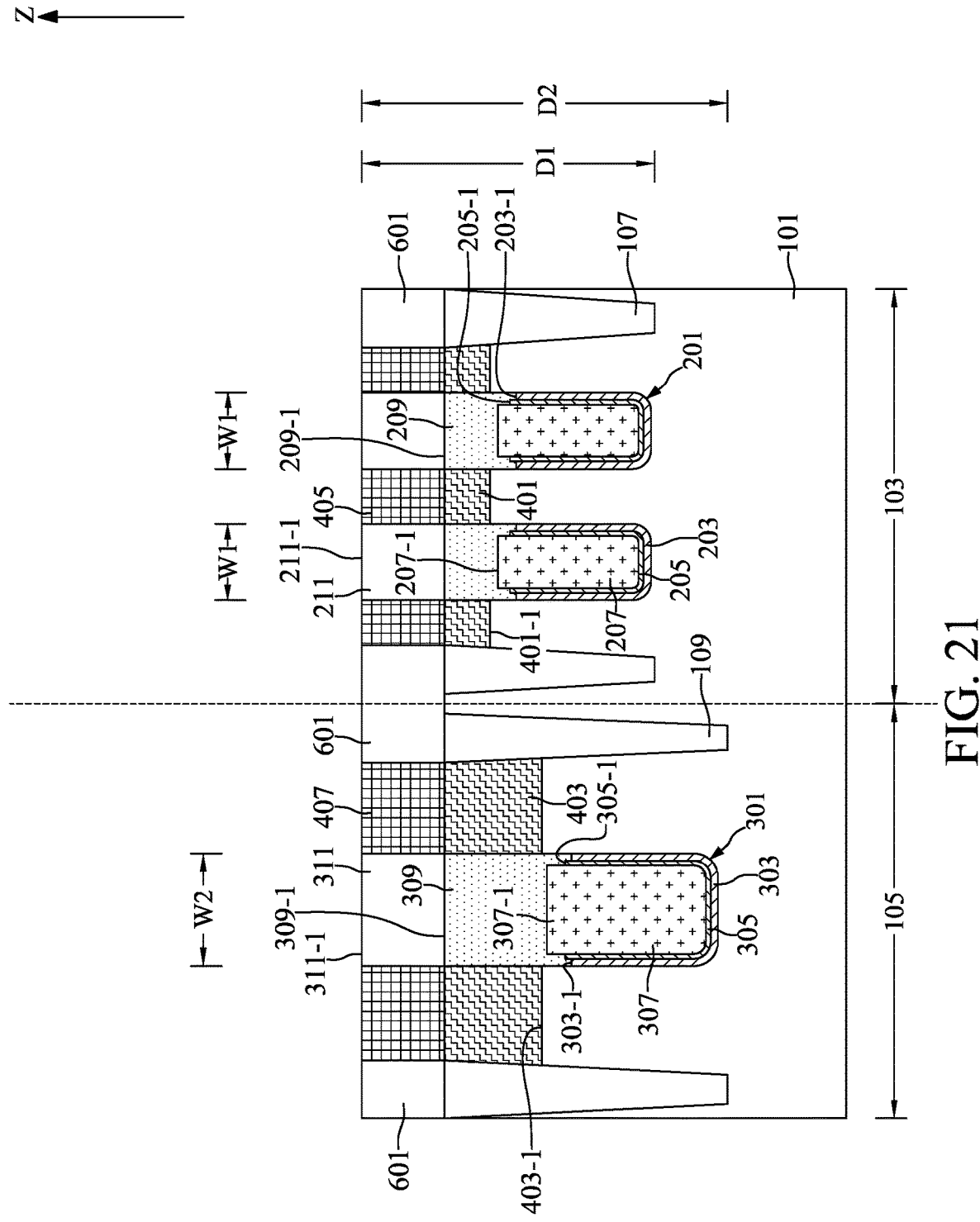

With reference to FIG. 20, a planarization process, such as chemical mechanical polishing, may be performed until the top surfaces of the first insulating layer 601 are exposed to remove excess material and provide a substantially flat surface for subsequent processing steps. With reference to FIG. 21, an implantation process may be performed to introduce dopant such as phosphorus, arsenic, or antimony into the semiconductor material 533 and turn the semiconductor material 533 into the plurality of third doped regions 405 and the plurality of fourth doped regions 407.

Due to the design of the semiconductor device of the present disclosure, different dimensions of gate structures (e.g., the plurality of first gate structures 201 and the second gate structure 301) may be easily fabricated with the assistance the loading effect. Therefore, the complexity of fabrication the semiconductor device may be reduced. As a result, the cost of fabrication of the semiconductor device may also be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate comprising an array area and a peripheral area adjacent to the array area;
a first gate structure positioned in the array area; and
a second gate structure positioned in the peripheral area;
wherein a width of the first gate structure is less than a width of the second gate structure, and a depth of the first gate structure is less than a depth of the second gate structure;
wherein the first gate structure comprises a first gate insulating layer inwardly positioned in the array area, a first gate conductive layer positioned on the first gate insulating layer, and a first bottom capping layer positioned on the first gate conductive layer, wherein a top surface of the first bottom capping layer is at a same vertical level as a top surface of the substrate.

2. The semiconductor device of claim 1, wherein a top surface of the first gate conductive layer is at a vertical level higher than a vertical level of top surfaces of the first gate insulating layer.

3. The semiconductor device of claim 2, further comprising a plurality of first doped regions positioned adjacent to two sides of the first gate structure, wherein bottom surfaces of the first doped regions are at a same vertical level as the top surface of the first gate conductive layer.

4. The semiconductor device of claim 3, further comprising a first gate liner positioned between the first gate insulating layer and the first gate conductive layer.

5. The semiconductor device of claim 4, wherein top surfaces of the first gate liner are at a vertical level lower than the vertical level of the top surface of the first gate conductive layer.

6. The semiconductor device of claim 5, further comprising a second gate structure comprising a second gate insulating layer inwardly positioned in the peripheral area, a second gate conductive layer positioned on the second gate insulating layer, and a second bottom capping layer positioned on the second gate conductive layer, wherein a top surface of the second bottom capping layer is at a same vertical level as the top surface of the substrate, and a top surface of the second gate conductive layer is at a vertical level lower than the vertical level of the top surface of the first gate conductive layer.

7. The semiconductor device of claim 6, further comprising a plurality of second doped regions positioned adjacent to two sides of the second gate structure, wherein bottom surfaces of the second doped regions are at a same vertical level as the top surface of the second gate conductive layer.

8. The semiconductor device of claim 7, further comprising a first top capping layer positioned on the first bottom capping layer.

9. The semiconductor device of claim 8, further comprising a plurality of third doped regions positioned adjacent to two sides of the first top capping layer and on the plurality of first doped regions.

10. The semiconductor device of claim 9, further comprising a plurality of first isolation structures positioned in the array area and a plurality of second isolation structures positioned in the peripheral area, wherein the first gate structure is positioned between an adjacent pair of the plurality of first isolation structures and the second gate structure is positioned between an adjacent pair of the plurality of second isolation structures.

11. The semiconductor device of claim 10, wherein a depth of the plurality of second isolation structures is greater than a depth of the plurality of first isolation structures.

12. The semiconductor device of claim 11, wherein a porosity of the first top capping layer is between about 10% and about 30%.

13. The semiconductor device of claim 11, wherein the first gate insulating layer has a thickness between about 13 angstroms and about 20 angstroms.

14. The semiconductor device of claim 11, wherein the first gate liner has a thickness between about 10 angstroms and about 15 angstroms.

15. A method for fabricating a semiconductor device, comprising:
  providing a substrate comprising an array area and a peripheral area adjacent to the array area;
  forming a first gate structure in the array area; and
  forming a second gate structure in the peripheral area and having a width greater than a width of the first gate structure and a depth greater than a depth of the first gate structure;
  wherein the first gate structure comprises a first gate insulating layer inwardly positioned in the array area, a first gate conductive layer positioned on the first gate insulating layer, and a first bottom capping layer positioned on the first gate conductive layer, wherein a top surface of the first bottom capping layer is at a same vertical level as a top surface of the substrate.

16. The method for fabricating the semiconductor device of claim 15, wherein the first gate structure and the second gate structure are concurrently formed.

17. The method for fabricating the semiconductor device of claim 16, further comprising:
  forming a plurality of first doped regions adjacent to two sides of the first gate structure and in the array area; and
  forming a plurality of second doped regions adjacent to two sides of the second gate structure and in the peripheral area.

18. The method for fabricating the semiconductor device of claim 17, further comprising:
  forming a plurality of third doped regions on the plurality of first doped regions; and
  forming a plurality of fourth doped regions on the plurality of second doped regions.

19. The method for fabricating the semiconductor device of claim 18, wherein the plurality of first doped regions and the plurality of third doped regions have different electrical types.

* * * * *